United States Patent
Yamaguchi

(10) Patent No.: US 12,072,175 B2
(45) Date of Patent: Aug. 27, 2024

(54) MEASUREMENT APPARATUS, MEASUREMENT METHOD, LITHOGRAPHY APPARATUS AND ARTICLE MANUFACTURING METHOD

(71) Applicant: CANON KABUSHIKI KAISHA, Tokyo (JP)

(72) Inventor: Wataru Yamaguchi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/166,695

(22) Filed: Feb. 9, 2023

(65) Prior Publication Data
US 2023/0273011 A1 Aug. 31, 2023

(30) Foreign Application Priority Data
Feb. 28, 2022 (JP) .................... 2022-030176

(51) Int. Cl.
*G01B 11/00* (2006.01)
*G01B 11/27* (2006.01)
(Continued)

(52) U.S. Cl.
CPC .......... *G01B 11/002* (2013.01); *G01B 11/272* (2013.01); *G01J 9/00* (2013.01);
(Continued)

(58) Field of Classification Search
CPC ..... G01B 11/002; G01B 11/272; G01B 11/03; G01J 9/00; G02B 26/06; G02B 27/0068;
(Continued)

(56) References Cited

U.S. PATENT DOCUMENTS 10,775,704 B2 9/2020 Pandey et al.
2012/0327503 A1 12/2012 Manassen et al.
(Continued)

FOREIGN PATENT DOCUMENTS

JP S63274802 A 11/1988
JP H06302504 A 10/1994
(Continued)

OTHER PUBLICATIONS

Extended European Search Report issued in European Appln. No. 23155291.0 mailed Jul. 19, 2023.

*Primary Examiner* — Peter B Kim
(74) *Attorney, Agent, or Firm* — ROSSI, KIMMS & McDOWELL LLP

(57) ABSTRACT

A measurement apparatus including an illumination system configured to illuminate a target with light including light of a first wavelength and light of a second wavelength, a wavefront changing unit configured to change a wavefront aberration in light from the target, and a control unit configured to control the wavefront changing unit, wherein the wavefront changing unit includes a first region where the light of the first wavelength enters, and a second region where the light of the second wavelength enters, and the control unit controls the wavefront changing unit such that a first correction wavefront for correcting a first wavefront aberration in the light of the first wavelength is generated in the first region, and a second correction wavefront for correcting a second wavefront aberration in the light of the second wavelength is generated in the second region.

26 Claims, 10 Drawing Sheets

(51) Int. Cl.
  *G01J 9/00*   (2006.01)
  *G02B 26/06*  (2006.01)
  *G02B 27/00*  (2006.01)
  *G03F 7/00*   (2006.01)
  *G03F 9/00*   (2006.01)

(52) U.S. Cl.
  CPC ......... *G02B 26/06* (2013.01); *G02B 27/0068* (2013.01); *G03F 7/706* (2013.01); *G03F 9/7088* (2013.01)

(58) Field of Classification Search
  CPC .. G03F 7/706; G03F 7/70633; G03F 7/70616; G03F 9/7046; G03F 9/7088; G03F 9/7092; G03F 9/7049; G03F 9/7069; G01N 21/956
  See application file for complete search history.

(56) References Cited

U.S. PATENT DOCUMENTS

| | | | |
|---|---|---|---|
| 2016/0291479 A1 | 10/2016 | Feijen et al. | |
| 2016/0334326 A1* | 11/2016 | Sapiens | G01B 11/24 |
| 2021/0271178 A1* | 9/2021 | Huisman | G01J 9/0215 |
| 2022/0099498 A1 | 3/2022 | Van Der Post et al. | |

FOREIGN PATENT DOCUMENTS

| | | | |
|---|---|---|---|
| JP | 2005127830 A | 5/2005 | |
| JP | 6644898 B2 | 2/2020 | |
| WO | 2017140528 A1 | 8/2017 | |
| WO | 2020151891 A1 | 7/2020 | |

\* cited by examiner

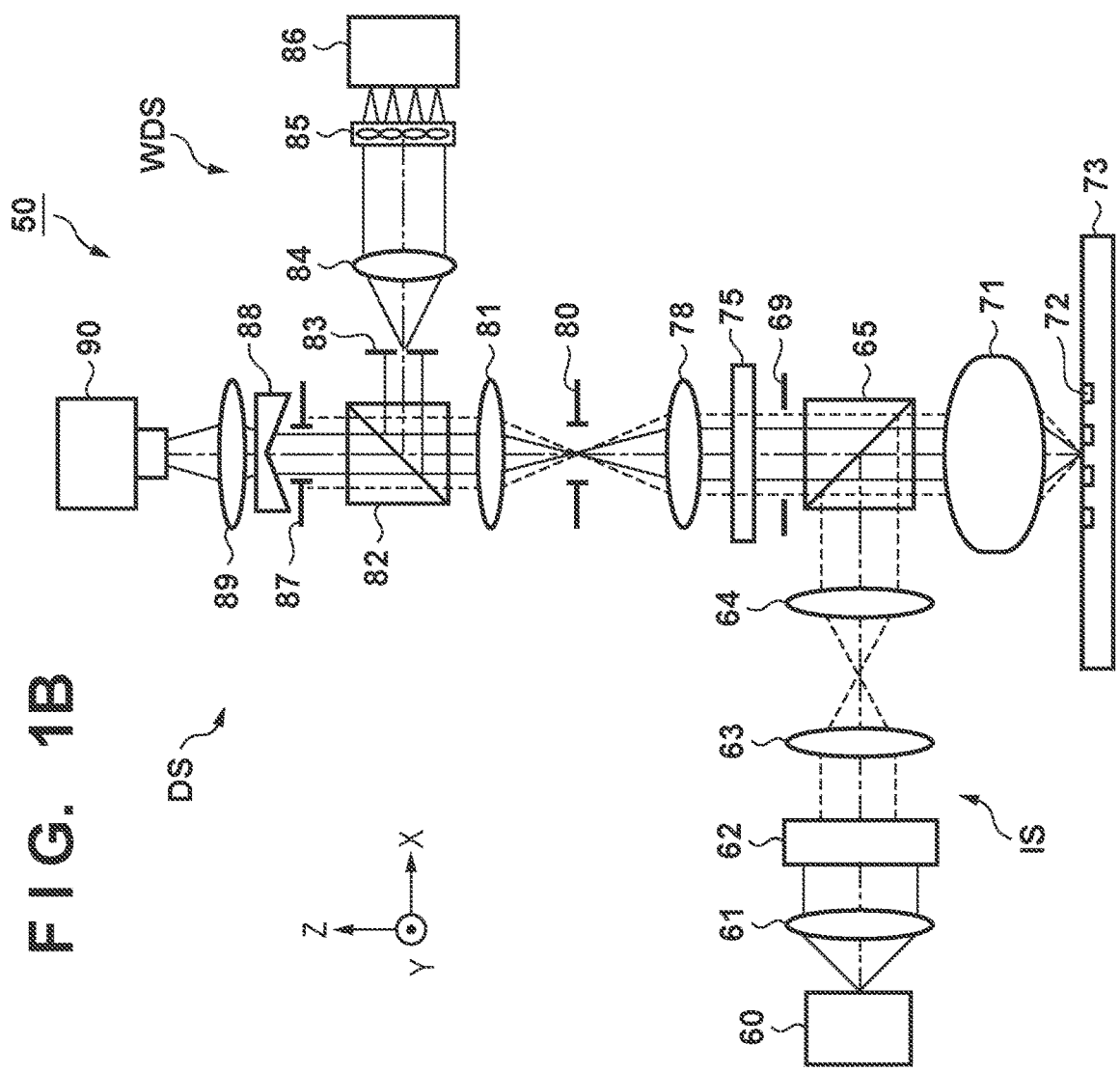
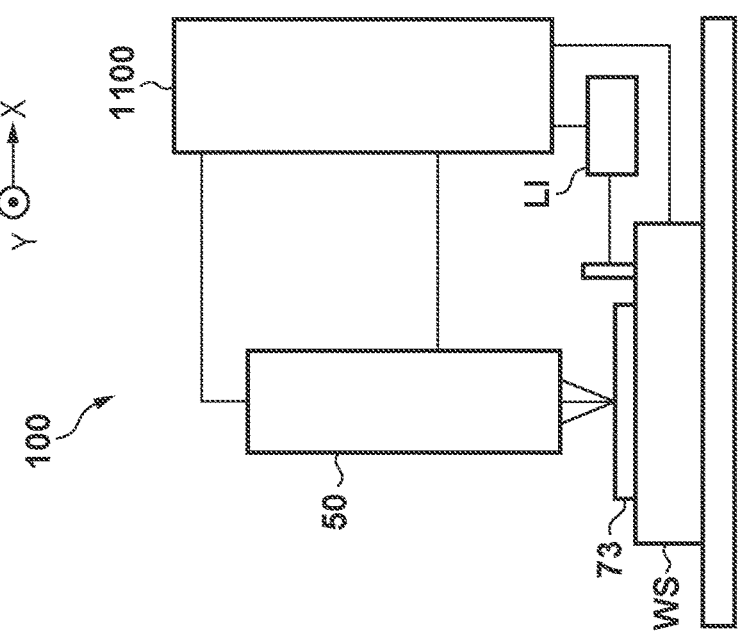
FIG. 1A
FIG. 1B

MEASUREMENT APPARATUS, MEASUREMENT METHOD, LITHOGRAPHY APPARATUS AND ARTICLE MANUFACTURING METHOD

BACKGROUND OF THE INVENTION

Field of the Invention

The present invention relates to a measurement apparatus, a measurement method, a lithography apparatus and an article manufacturing method.

Description of the Related Art

In recent years, due to high integration and miniaturization of semiconductor integrated circuits, the line width of a pattern to be formed on a substrate has become extremely small. Therefore, further miniaturization is required in a lithography process of forming the pattern (resist pattern) on the substrate. In a step-and-repeat type exposure apparatus or a step-and-scan type exposure apparatus which is used in the lithography process, a pattern is formed on a substrate by imaging the light (exposure light) from an original at a predetermined position on the substrate through a projection optical system. Accordingly, in order to meet the demand for pattern miniaturization, it is important to align the relative positions of the original and the substrate with high accuracy. Further, along with miniaturization of a pattern, also in measurement of an overlay error between patterns formed on the substrate, it is important to measure, with high accuracy, the patterns formed in different layers on the substrate.

Japanese Patent No. 6644898 proposes a technique for measuring, with high accuracy, the position of a target such as a pattern formed on a substrate. Japanese Patent No. 6644898 discloses a technique of applying light having multiple wavelengths different from each other to a target region and a target peripheral region (physical properties or optical properties thereof), and detecting the light from the target. In substrate process treatment, so-called process fluctuations may occur, in which the physical property and film thickness of the material, the shape of the target, and the like fluctuate. By acquiring the position information of the target using the light having multiple wavelengths, a measurement error caused by the process fluctuations is decreased, and the position of the target can be obtained with high accuracy. In the technique disclosed in Japanese Patent No. 6644898, a split wavelength selection filter, which splits and transmits the light having different wavelengths, is arranged inside an optical system to simultaneously detect light components of different wavelengths. This can implement high-speed and high-accuracy measurement.

However, in a detection optical system that detects light from a target formed on a substrate, if aberration correction is insufficient, a measurement error occurs upon simultaneous detection of light components of multiple wavelengths different from each other, and this leads to a degradation in measurement accuracy.

SUMMARY OF THE INVENTION

The present invention provides a measurement apparatus advantageous in measuring the position of a target.

According to one aspect of the present invention, there is provided a measurement apparatus for measuring a position of a target, including an illumination system configured to illuminate the target with light including light of a first wavelength and light of a second wavelength different from the first wavelength, a wavefront changing unit configured to change a wavefront aberration in light from the target, and a control unit configured to control the wavefront changing unit, wherein the wavefront changing unit includes a first region where the light of the first wavelength enters, and a second region where the light of the second wavelength enters, and the control unit controls the wavefront changing unit such that a first correction wavefront for correcting a first wavefront aberration in the light of the first wavelength is generated in the first region, and a second correction wavefront for correcting a second wavefront aberration in the light of the second wavelength is generated in the second region.

Further aspects of the present invention will become apparent from the following description of exemplary embodiments with reference to the attached drawings.

BRIEF DESCRIPTION OF THE DRAWINGS

FIGS. 1A and 1B are schematic views illustrating configurations of a measurement apparatus according to an aspect of the present invention.

DESCRIPTION OF THE EMBODIMENTS

Figure 2C:
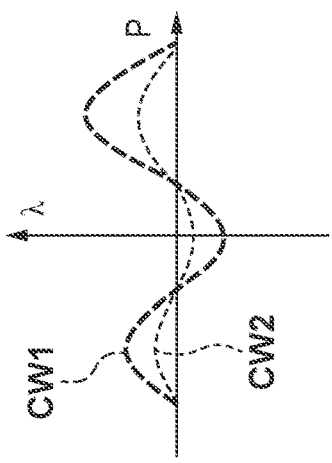
FIGS. 2A to 2E are views for explaining the measurement process of a measurement unit in the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1A is a schematic view illustrating configurations of a measurement apparatus 100 according to the first embodiment of the present invention. The measurement apparatus 100 has a function as an overlay measurement apparatus (overlay inspection apparatus) that measures the relative positions of a plurality of patterns (targets) provided in different layers on a substrate 73 (on a target object). The measurement apparatus 100 also has a function as a position measurement apparatus that measures the position of the pattern (target) provided on the substrate 73. As illustrated in FIG. 1A, the measurement apparatus 100 includes a substrate stage WS which holds the substrate 73, a measurement unit 50, and a control unit 1100.

The substrate 73 is the target object whose alignment error and overlay error are measured by the measurement apparatus 100. The substrate 73 is, for example, a substrate used to manufacture a device such as a semiconductor device or a liquid crystal display device and, more specifically, includes a wafer, a liquid crystal substrate, another processing target substrate, or the like.

The substrate stage WS holds the substrate 73 via a substrate chuck (not illustrated), and is connected to a substrate driving mechanism (not illustrated). The substrate driving mechanism includes a linear motor or the like, and can move the substrate 73 held by the substrate stage WS by driving the substrate stage WS in the X-axis direction, the Y-axis direction, the Z-axis direction, and the rotation directions around the respective axes. The position of the substrate stage WS is monitored by, for example, a 6-axis laser interferometer LI or the like, and the substrate stage WS is driven to a predetermined position under the control of the control unit 1100.

The control unit 1100 is formed by a computer (information processing apparatus) including a CPU, a memory, and the like and, for example, operates the measurement apparatus 100 by comprehensively controlling respective units of the measurement apparatus 100 in accordance with a program stored in a storage unit. In this embodiment, the control unit 1100 controls a measurement process in the measurement apparatus 100 and a correction process (calculation process) of a measurement value obtained by the measurement apparatus 100.

With reference to FIG. 1B, configurations of the measurement unit 50 will be described. The measurement unit 50 includes an illumination system IS for illuminating the substrate 73 using the light from a light source 60, and a detection system DS for guiding, to a detection unit 90, the light from a measurement target 72 provided on the substrate 73. The detection unit 90 functions as a light intensity detection unit that includes a plurality of pixels for detecting the light from the target 72 and forms a detection region for detecting the intensity of the light from the target 72 by the plurality of pixels.

In this embodiment, the target 72 provided on the substrate 73 is a pattern used to measure the overlay error and alignment error of the substrate 73. More specifically, the target 72 is a pattern for overlay inspection, and formed by the first pattern formed in the first layer on the substrate 73 and the second pattern formed in the second layer different from the first layer. Accordingly, the overlay error in the target 72 can be obtained by measuring the positions of the first pattern and the second pattern.

Before explaining the details of the measurement unit 50 in this embodiment, configurations of a general measurement unit 950 used in the measurement apparatus 100 will be described with reference to FIGS. 9A to 9C.

Figure 9A:
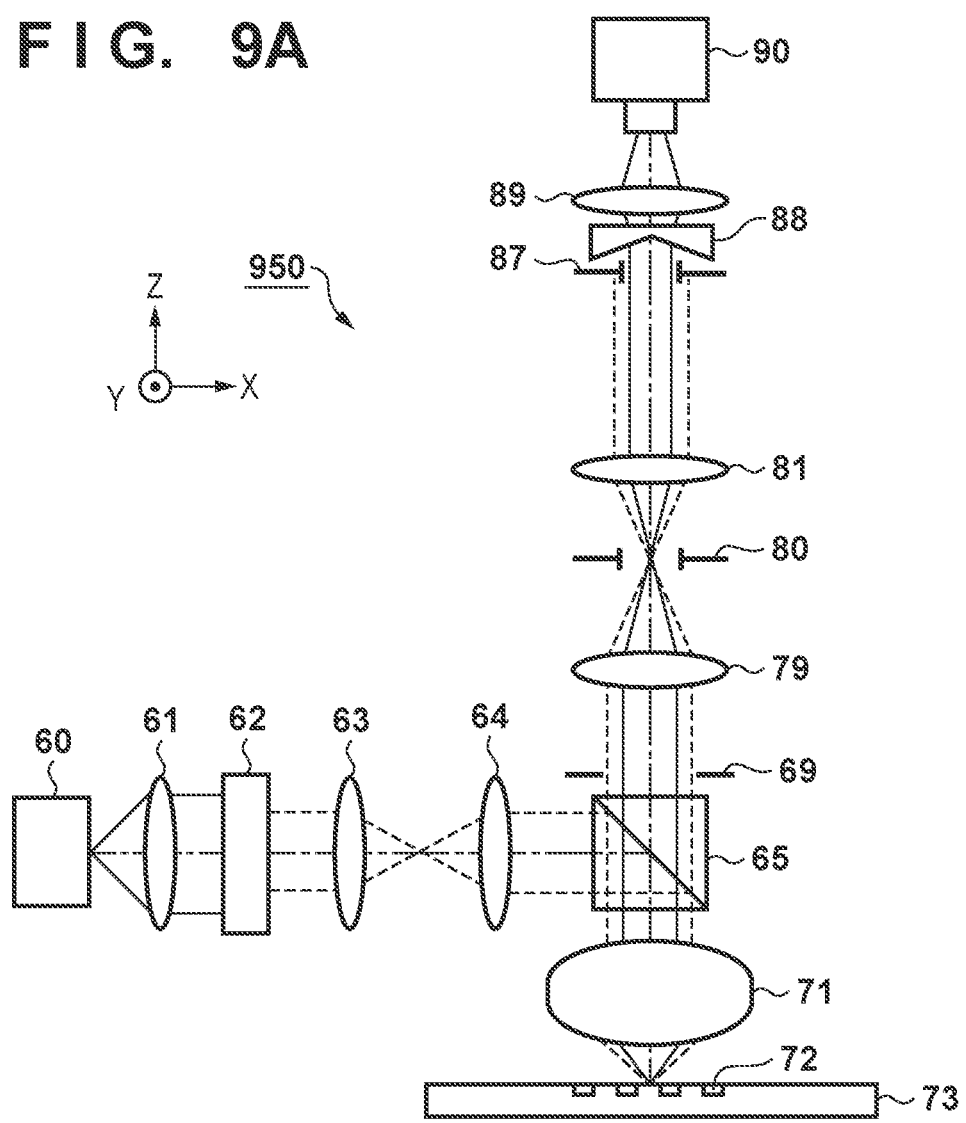
FIGS. 9A to 9C are views for explaining a general measurement unit used in the measurement apparatus.

FIG. 9A is a schematic view illustrating configurations of the measurement unit 950. The light (illumination light) emitted from the light source 60 is guided to an illumination aperture stop mechanism 62 via an illumination optical system 61. The light source 60 includes, for example, a light source such as a laser light source, an LED, or a halogen lamp, and emits light including light of the first wavelength and light of the second wavelength different from the first wavelength. The illumination aperture stop mechanism 62 includes an illumination aperture stop plate (not illustrated) provided with a plurality of illumination aperture stops different from each other, and a driving mechanism that drives the illumination aperture stop plate. The driving mechanism includes a linear motor or the like, and can align the desired illumination aperture stop with respect to the illumination light by, for example, driving the illumination aperture stop plate in the Y-axis direction, the Z-axis direction, and the wX direction. The illumination aperture stop mechanism 62 is monitored by, for example, an encoder or an interferometer, and the illumination aperture stop is driven to a predetermined position under the control of the control unit 1100. In the illumination aperture stop mechanism 62, by selecting (driving) the illumination aperture stop with respect to the light of a wide wavelength band emitted from the light source 60, the measurement condition and the incident angle of the illumination light with respect to the substrate 73 (target 72) can be adjusted (changed). The light having passed through the illumination aperture stop mechanism 62 is guided to a beam splitter 65 via illumination optical systems 63 and 64. The light reflected by the beam splitter 65 illuminates the target 72 provided on the substrate 73 via an objective optical system 71.

The light reflected, diffracted, and scattered by the target 72 provided on the substrate 73 passes through the beam splitter 65, an aperture stop 69, and an imaging optical system 79 via the objective optical system 71, and is guided to a detection field stop 80. The light from the detection field stop 80 passes through an imaging optical system 81 and a detection aperture stop 87, and is guided to the detection unit 90 via a wedge member 88 and an imaging optical system 89.

Figure 9B:
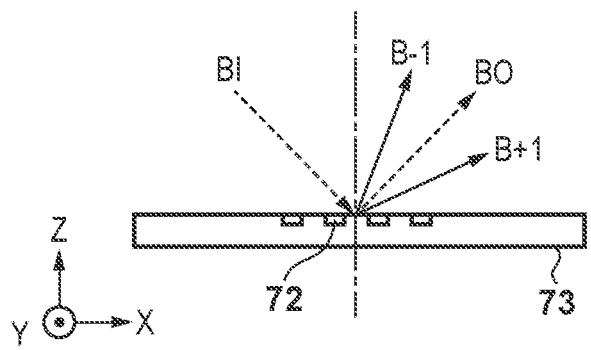

FIG. 9B is a view illustrating light (illumination light) BI entering the target 72 provided on the substrate 73, 0th-order diffracted light BO, +1st-order diffracted light B+1, and −1st-order diffracted light B−1. For example, by adjusting the incident angle of the illumination light in the illumination aperture stop mechanism 62, the −1st-order diffracted light B−1 and 0th-order diffracted light BO diffracted by the target 72 are guided to the detection aperture stop 87 via the objective optical system 71. The detection aperture stop 87 is configured to block the 0th-order diffracted light BO. Accordingly, letting the incident angle of the light BI in the Z-X plane be +θ, when both of the light component having an incident angle of +θ and the light component having an incident angle of −θ are applied via the illumination aperture stop mechanism 62, the 1st-order diffracted light components from the target 72 are guided to the detection unit 90. The wedge member 88 changes the angles of the 1st-order diffracted light components using refraction and diffraction, thereby shifting the relative positions of the 1st-order diffracted light components on the detection plane (X-Y plane) of the detection unit 90. Thus, as illustrated in FIG. 9A, by making the light components enter the target 72 at incident angles symmetric with respect to the optical axis, the detection unit 90 can simultaneously detect the +1st-order diffracted light and the −1st-order diffracted light.

Figure 9C:
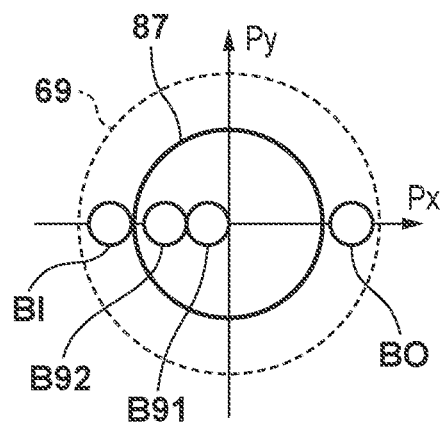

FIG. 9C is a view illustrating the relative position, on the pupil plane, of the inner diameter of the aperture portion of each of the illumination aperture stop, the aperture stop 69, and the detection aperture stop 87 which are in a pupil conjugate relationship. As has been described above, in the measurement unit 950, the 0th-order diffracted light BO having passed through the aperture stop 69 is blocked by the detection aperture stop 87. Accordingly, the position of each of the light BI and the 0th-order diffracted light BO is a position where the light passes inside the aperture stop 69 (aperture thereof) but is blocked outside the detection aperture stop 87 (aperture thereof). In FIG. 9C, B91 indicates the +1st-order diffracted light in the light of the first wavelength, B92 indicates the +1st-order diffracted light in the light of the second wavelength, and both of them pass inside the detection aperture stop 87 and are detected by the detection unit 90.

In general, if d is the period of the pattern (grid pattern) of the target 72, α is the incident angle of light with respect to the target 72, β is the diffraction angle, λ is the wavelength, and m is the diffraction order, following equation (1) holds:

$$d(\sin \alpha + \sin \beta) = m \cdot \lambda \quad (1)$$

Therefore, when light components of multiple wavelengths enter the target 72 at the same angle, the diffraction angle of each light component changes in accordance with the wavelength, and the diffracted light components pass through different positions on the pupil plane. Note that FIG. 9C is a view for explaining the outline of the positional relationship among the three aperture stops which are in the pupil conjugate relationship, and the aperture diameter of each aperture stop may be changed.

In the measurement unit 950, using the above-described characteristics, each of the illumination aperture stop mechanism 62 and the detection aperture stop 87 located at pupil conjugate positions adopts a split wavelength filter that allows (transmits) light components of different wavelengths to pass therethrough in accordance with the position. With this, it is possible to avoid mixture of an unnecessary light component and simultaneously detect the light components of multiple wavelengths with high accuracy.

Next, the reason why the accuracy (measurement accuracy) of measuring the position of the target 72 is degraded in the measurement unit 950 will be described. In the configuration in which the light having multiple wavelengths is applied to the target 72 and the diffracted light is detected, it is required to achieve both a lens having a high NA and highly accurate aberration correction. For example, if the NA of the objective optical system 71 is low, the detection range of diffracted light from the target 72 decreases, and this makes it difficult to detect the diffracted light and separate the wavelengths by the split wavelength filter, resulting in a degradation in measurement accuracy. Further, in the objective optical system 71 or the imaging optical system 79, if the aberration correction at the time of designing is insufficient or if an eccentricity error occurs during manufacturing or assembly, the light from the target 72 guided to the detection unit 90 becomes asymmetric or blurred, resulting in a degradation in measurement accuracy. Accordingly, if both a lens having a high NA and highly accuracy aberration correction cannot be achieved, a measurement error occurs upon simultaneous detection of the light components of multiple wavelengths, resulting in a degradation in measurement accuracy.

To solve this problem, in this embodiment, a wavefront detection system WDS is used in the measurement unit 50 to acquire the wavefront aberration information (the first wavefront aberration and the second wavefront aberration) concerning the wavefront aberrations in the detection system DS. Then, a wavefront changing unit 75 is divided into two regions (the first region and the second region), and correction wavefronts (the first correction wavefront and the second correction wavefront) are set (generated) in the respective regions so as to correct the wavefront aberrations in the detection system DS. With this configuration, a degradation in measurement accuracy is decreased (prevented), and this is advantageous in measuring the position of the target 72.

With reference to FIG. 1B, configurations of the measurement unit 50 in this embodiment will be described below in details. In the measurement unit 50, configurations except the wavefront changing unit 75 and the wavefront detection system WDS from a beam splitter 82 to a wavefront detection unit 86 are similar to those in the measurement unit 950, so that a detailed description thereof will be omitted here.

The light reflected, diffracted, and scattered by the target 72 provided on the substrate 73 is guided to the wavefront changing unit 75 via the objective optical system 71, the beam splitter 65, and the aperture stop 69. The wavefront changing unit 75 has a function of changing the wavefront aberration in the light from the target 72. The wavefront changing unit 75 includes, for example, a spatial modulation element that can two-dimensionally change the phase of light in the optical axis cross section, or a liquid crystal spatial light phase modulator that includes, as a light modulation unit, a liquid crystal layer in which liquid crystal molecules are aligned parallel to the substrate.

The light from the wavefront changing unit 75 passes through an imaging optical system 78, the detection field stop 80, and the imaging optical system 81, and is guided to the beam splitter 82. The beam splitter 82 splits the incident light into two light beams at a desired light amount ratio. The light beam transmitted by the beam splitter 82 is guided to the detection unit 90 via the detection aperture stop 87, the wedge member 88, and the imaging optical system 89.

On the other hand, the light beam reflected by the beam splitter 82 is guided to the wavefront detection unit 86 via a pinhole 83, a pupil imaging optical system 84, and a lens array 85. The pinhole 83 is preferably arranged at a position conjugate with the detection aperture stop 87.

In the measurement unit 50, wavefront aberration information concerning the wavefront aberrations in the detection system DS including the objective optical system 71 and the imaging optical systems 78 and 81 is obtained (detected) via the wavefront detection unit 86. Then, in the control unit 1100, a correction wavefront for correcting the wavefront aberrations in the detection system DS is generated based on the wavefront aberration information acquired by the wavefront detection unit 86, and the correction wavefront is set in the wavefront changing unit 75. In this manner, in this embodiment, the correction wavefront for correcting the wavefront aberrations in the detection system DS is set in the wavefront changing unit 75. With this, the wavefront aberrations in the detection system DS are decreased, and it becomes possible to detect the target 72 with high accuracy even by using the light having multiple different wavelengths. Note that acquisition of the wavefront aberration information and generation of the correction wavefront will be described later in detail.

Figure 2E:
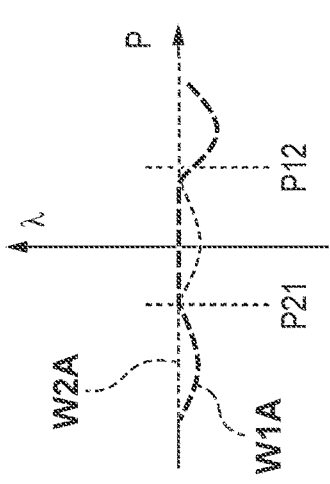
Figure 2B:
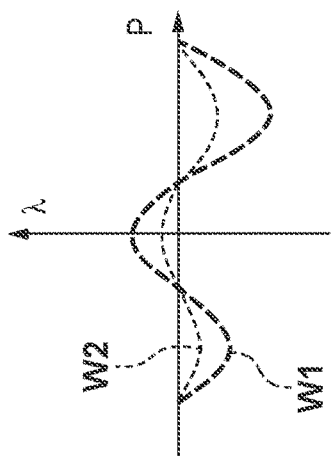
Figure 2D:
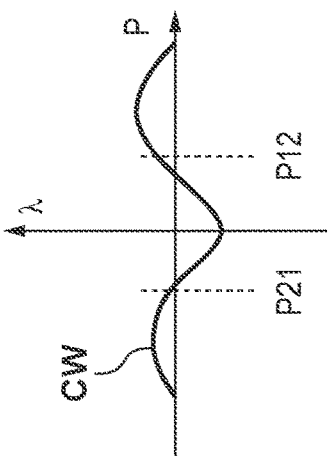
Figure 2A:
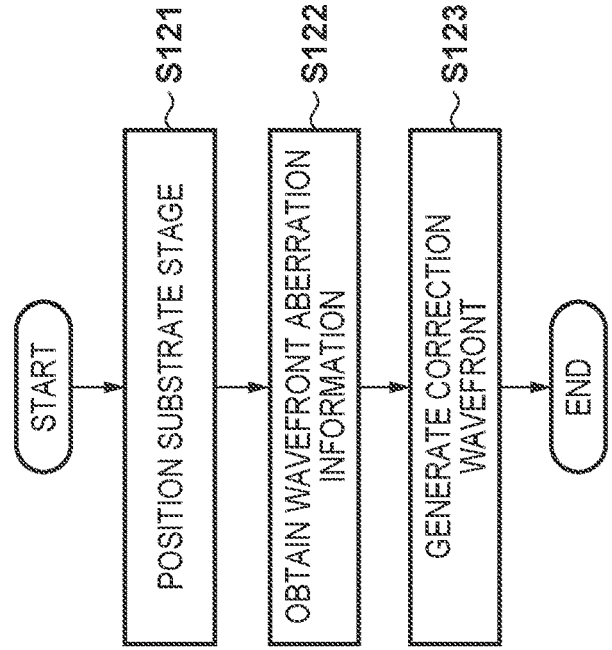

With reference to FIG. 2A, the measurement process (measurement method) of the measurement unit 50 in this embodiment will be described. The measurement process is characterized by using the wavefront changing unit 75 and the wavefront detection unit 86, and performed by the control unit 1100 comprehensively controlling respective units of the measurement apparatus 100 as described above.

In step S121, the substrate stage WS holding the substrate 73 is positioned such that the light from the target 72 is guided to the detection unit 90 (detection region thereof) in the measurement unit 50. In addition, the substrate stage WS holding the substrate 73 is positioned concerning the Z-direction position of the substrate 73 with respect to the measurement unit 50 such that, for example, the intensity of the light from the target 72 is acquired and the light intensity or a change thereof becomes equal to or larger than a target value. Note that the position of the substrate 73 on the X-Y plane with respect to the measurement unit 50 need not be a position where the light from the target 72 is guided to the detection unit 90. For example, the Z-direction position of the substrate stage WS (substrate 73) is decided based on the intensity of light from the target 72. After this, the substrate stage WS may be driven on the X-Y plane to position the substrate stage WS such that a region where no target 72 has been formed on the substrate is located with respect to the detection unit 90. Alternatively, the substrate stage WS may be positioned such that the light from a reference pattern provided on a reference plate arranged on the substrate stage in place of the substrate 73 is guided to the detection unit 90.

In step S122, the wavefront detection system WDS, that is, the wavefront detection unit 86 acquires wavefront aberration information concerning the wavefront aberrations in the detection system DS. As has been described above, the wavefront aberration information is acquired by detecting, by the wavefront detection unit 86, the light having passed through the pinhole 83, the pupil imaging optical system 84, and the lens array 85. In this embodiment, the wavefront aberration information concerning the wavefront aberrations in the detection system DS includes the first wavefront aberration in the light of the first wavelength and the second wavefront aberration in the light of the second wavelength.

In step S123, based on the wavefront aberration information acquired in step S122, a correction wavefront for correcting the wavefront aberrations in the detection system DS is generated.

Here, acquisition of the wavefront aberration information in step S122 will be described. FIG. 2B is a view illustrating an example of the wavefront aberrations in the detection system DS acquired by the wavefront detection unit 86, in which the ordinate represents the phase shift amount (wavefront aberration) from the reference sphere, and the abscissa represents the position on the pupil plane. In FIG. 2B, W1 indicates the first wavefront aberration in the light of the first wavelength, and W2 indicates the second wavefront aberration in the light of the second wavelength. As has been described above, if the detection system DS has a large wavefront aberration, the light from the target 72 guided to the detection unit 90 becomes asymmetric or blurred, resulting in a degradation in measurement accuracy. Hence, it is preferable to suppress the influence of the wavefront aberrations in the detection system DS.

One of methods of acquiring the wavefront aberration information in the light having multiple wavelengths is a method of illuminating the substrate 73 (or reference plate) with the light having multiple wavelengths and detecting, by the wavefront detection unit 86, the light having multiple wavelengths diffracted by the target 72. For example, the wavefront aberration information may be acquired by detecting the light components having different diffraction angles in accordance with the wavelengths at different positions in the wavefront detection unit 86 (on the detection plane thereof). Alternatively, as another method, for example, the wavefront aberration information in the light having multiple wavelengths may be acquired by switching a wavelength filter (not illustrated) in the illumination system IS to sequentially illuminate the substrate 73 with the light of the first wavelength and the light of the second wavelength.

Next, generation of the correction wavefront in step S123 will be described. FIG. 2C is a view illustrating the correction wavefront generated (calculated) by the control unit 1100 based on the wavefront aberrations illustrated in FIG. 2B, that is, the wavefront aberration information concerning the wavefront aberrations in the detection system DS. This correction wavefront is a correction wavefront for correcting the wavefront aberrations in the detection system DS. In FIG. 2C, CW1 indicates the first correction wavefront for correcting the first wavefront aberration in the light of the first wavelength, and CW2 indicates the second correction wavefront for correcting the second wavefront aberration in the light of the second wavelength. For example, the first correction wavefront CW1 is generated so as to cancel the first wavefront aberration W1 occurring in the detection system DS, and the second correction wavefront CW2 is generated so as cancel the second wavefront aberration W2 occurring in the detection system DS.

FIG. 2D is a view illustrating an example of a correction wavefront CW generated in the control unit 1100 from the first correction wavefront CW1 and the second correction wavefront CW2 illustrated in FIG. 2C. The correction wavefront CW is generated based on, in addition to the first correction wavefront CW1 and the second correction wavefront CW2, the positions where the light of the first wavelength and the light of the second wavelength are transmitted in the wavefront changing unit 75. In FIG. 2D, each of P21 and P12 indicates the boundary portion between the position where the light of the first wavelength is transmitted and the position where the light of the second wavelength is transmitted in the wavefront changing unit 75. More specifically, upon measuring the position of the target 72, the light of the first wavelength is transmitted through the first region (P21<P<P12), and the light of the second wavelength is transmitted through the second region (P<P21 and P12<P) in the wavefront changing unit 75. Note that the position where the light of each wavelength is transmitted in the wavefront changing unit 75 may be obtained from the diffraction angle calculated based on the information of the periodic structure of the target 72.

When generating the correction wavefront CW, the control unit 1100 may smoothly connect the first correction wavefront CW1 in the first region (P21<P<P12) and the second correction wavefront CW2 in the second region (P<P21 and P12<P). In other words, the correction wavefront CW for correcting the first wavefront aberration W1 and the second wavefront aberration W2 may be obtained by connecting the first correction wavefront CW1 and the second correction wavefront CW2 so as to correspond to the first region and the second region. At this time, the correction wavefront CW may be generated by connecting the first correction wavefront CW1 in the first region and the second correction wavefront CW2 in the second region in the radial direction of the pupil plane. Alternatively, the correction wavefront CW for correcting the first wavefront aberration W1 and the second wavefront aberration W2 may be obtained by smoothly connecting the first wavefront aberration W1 and the second wavefront aberration W2. In other words, the correction wavefront CW for correcting the first wavefront aberration W1 and the second wavefront aberration W2 may be obtained from a third wavefront aberration obtained by connecting the first wavefront aberration W1 and the second wavefront aberration W2 so as to correspond to the first region and the second region. At this time, the correction wavefront CW may be generated by connecting the first wavefront aberration W1 and the second wavefront aberration W2 in the radial direction on the pupil plane. Note that the correction wavefront CW is not limited to the correction wavefront for correcting the first wavefront aberration W1 and the second wavefront aberration W2, but may be a correction wavefront for correcting at least one of the first wavefront aberration W1 and the second wavefront aberration W2. For example, if one of the first wavefront aberration W1 and the second wavefront aberration W2 falls within an allowable range, a correction wavefront for correcting the wavefront aberration falling outside the allowable range may be generated.

As another method of generating the correction wavefront CW, the target 72 may be illuminated with the light having multiple wavelengths, the wavefront aberrations in the light having multiple wavelengths diffracted by the target 72 may be simultaneously acquired, and the correction wavefront CW may be generated so as to cancel the wavefront aberrations. This has an advantage that the time (processing time) required for generating the correction wavefront CW can be shortened as compared to the case of sequentially acquiring the wavefront aberrations in the light having multiple different wavelengths.

Note that in this embodiment, the case of generating the correction wavefront for the light of the first wavelength and the light of the second wavelength has been described. However, the number of wavelengths is not limited to two, and it is also possible to generate a correction wavefront for light having three or more different wavelengths.

The correction wavefront is not limited to canceling (decreasing) the wavefront aberrations in the detection system DS. It is possible to decrease a measurement error by generating the correction wavefront so as to decrease an asymmetric factor (for example, an asymmetric wavefront aberration such as a coma aberration) which causes the measurement error due to the detection system DS. Further, by generating the correction wavefront so as to correct a difference in focal position between the first correction wavefront and the second correction wavefront, it is possible to decrease a measurement error caused by the focal position shift upon simultaneous detection of the light components of multiple wavelengths diffracted by the target 72. Further, the correction wavefront may be generated by obtaining, based on information (to be referred to as "position measurement information") indicating the relationship between the wavefront aberration information and an error (measurement error) in measurement of the position of the target 72, the wavefront aberration with which the measurement error becomes equal to or smaller than an allowable value. For example, in the control unit 1100, a library may be created by collecting in advance data (position measurement information) concerning the wavefront aberration information and the measurement error, and an optimal correction wavefront may be generated (decided) from the library and the wavefront aberration information acquired upon measuring the position of the target 72. When creating the library, the measurement error may be calculated by referring to the measurement value of another optical overlay measurement apparatus or scanning electronic microscope, and obtaining the difference between the referred measurement value and the measurement value of the measurement apparatus 100. With this, the time required for generating the correction wavefront can be shortened as compared to the case of acquiring the position measurement information upon measuring the position of the target 72.

FIG. 2E is a view illustrating an example of the wavefront aberration detected by the wavefront detection unit 86 in a case in which the correction wavefront CW illustrated in FIG. 2D is set in the wavefront changing unit 75. Note that setting the correction wavefront CW in the wavefront changing unit 75 means controlling the wavefront changing unit 75 such that the first correction wavefront CW1 is generated in the first region of the wavefront changing unit 75 and the second correction wavefront CW2 is generated in the second region of the wavefront changing unit 75. In FIG. 2E, W1A indicates the wavefront aberration in the light of the first wavelength, and W2A indicates the wavefront aberration in the light of the second wavelength.

Referring to FIG. 2E, in the first region (P21<P<P12) of the wavefront changing unit 75, the first wavefront aberration W1 illustrated in FIG. 2B is canceled (corrected) by the correction wavefront CW (first correction wavefront CW1) and becomes the wavefront aberration W1A. Similarly, in the second region (P<P21 and P12<P) of the wavefront changing unit 75, the second wavefront aberration W2 illustrated in FIG. 2B is canceled (corrected) by the correction wavefront CW (second correction wavefront CW2) and becomes the wavefront aberration W2A. In this manner, by setting the correction wavefront CW in the wavefront changing unit 75, the wavefront aberrations in the detection system DS can be decreased for the light of the first wavelength and the light of the second wavelength diffracted by the target 72. Accordingly, the measurement apparatus 100 can measure the position (overlay error) of the target 72 with high accuracy.

Note that setting the correction wavefront for correcting the wavefront aberrations in the detection system DS is not limited to controlling the wavefront changing unit 75 by the control unit 1100. For example, the correction wavefront for correcting the first wavefront aberration and the second wavefront aberration may be generated based on the wavefront aberration information acquired by the wavefront detection unit 86, and an optical member (for example, an aspheric lens) having the characteristics equivalent to those of the correction wavefront may be arranged at the position of the wavefront changing unit 75. By selecting an appropriate optical member from a plurality of optical members having wavefront aberrations different from each other based on the wavefront aberration information and the correction wavefront, the correction wavefront corresponding to the wavefront aberration information can be set at the position of the wavefront changing unit 75.

In the measurement apparatus 100 in this embodiment, each of the detection unit 90 and the wavefront detection unit 86 detects the light from the target 72 via the wavefront changing unit 75. In the wavefront changing unit 75, the first correction wavefront CW1 is set in the first region so as to correct the first wavefront aberration W1 and the second correction wavefront CW2 different from the first correction wavefront CW1 is set in the second region so as to correct the second wavefront aberration W2. With this, it is possible to decrease a measurement error caused by the wavefront aberrations in the detection system DS, and measure the position of the target 72, that is, the overlay error of the target 72 with high accuracy.

Second Embodiment

Figure 3A:
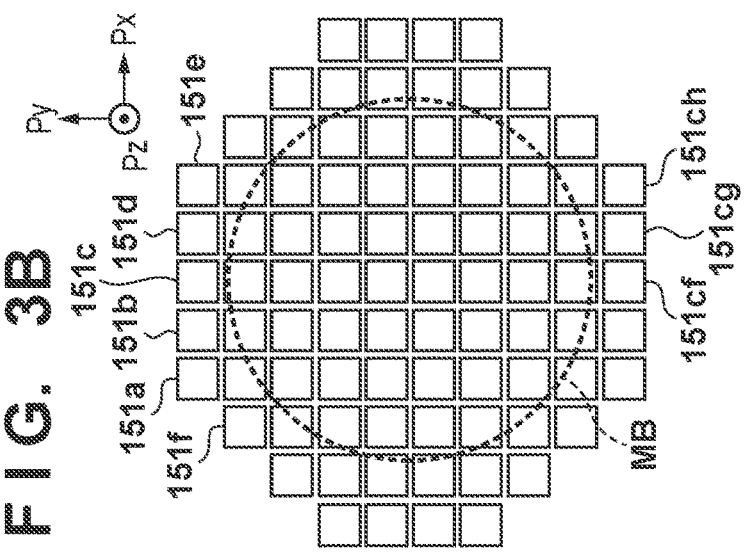
FIGS. 3A to 3C are views for explaining a measurement unit in the second embodiment.
Figure 3B:
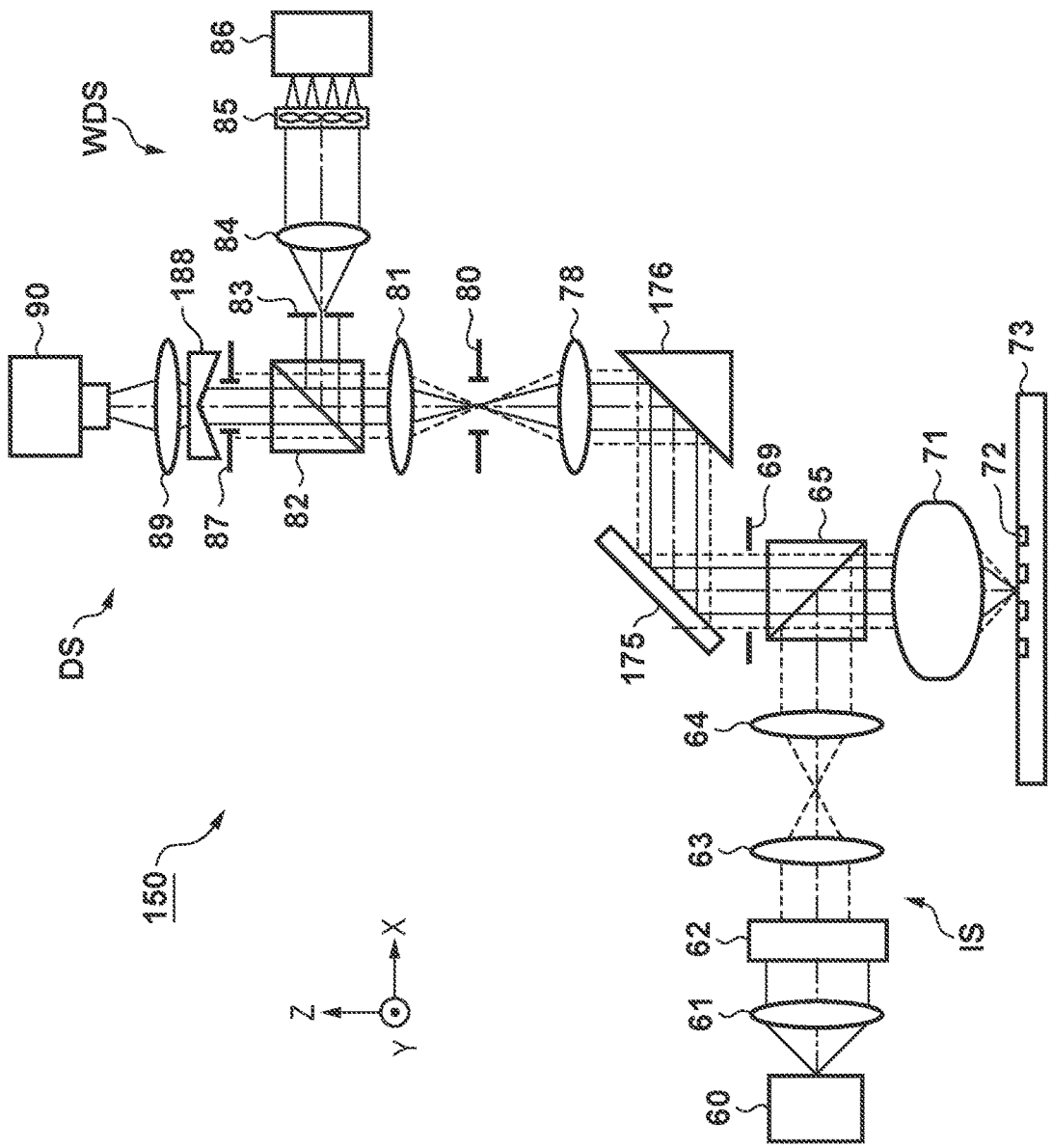
Figure 3C:
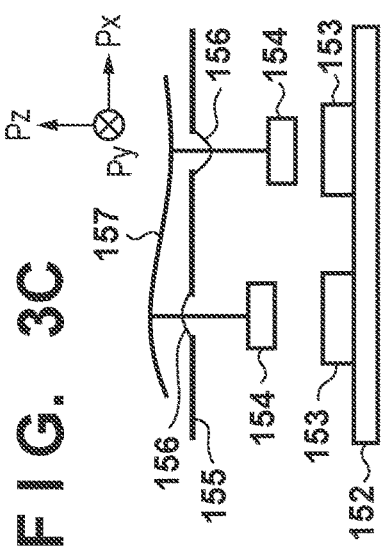

In this embodiment, a form in which the light from a target 72 is reflected by a wavefront changing unit 175 and detected by a detection unit 90 will be described with reference to FIGS. 3A to 3C. FIGS. 3A to 3C are views for explaining a measurement unit 150 in this embodiment.

FIG. 3A is a view illustrating configurations of the measurement unit 150. The measurement unit 150 corresponds to the measurement unit 50 in the measurement apparatus 100 illustrated in FIG. 1B. The measurement unit 150 is different from the measurement unit 50 in the first embodiment in that the light from the target 72 is reflected by the wavefront changing unit 175, further reflected by a mirror 176, and detected by the detection unit 90 via imaging optical systems 78, 81, and 89.

As illustrated in FIG. 3B, the wavefront changing unit 175 includes, for example, a shape deformable mirror 151. FIG. 3B is a view illustrating an example of configurations of the shape deformable mirror 151. The shape deformable mirror 151 includes a reflective film 157 forming a reflective surface which reflects the light from the target 72, and a plurality of actuators 151a to 151ch two-dimensionally arrayed below the reflective film 157. The actuators 151a to 151ch are formed by mechanical or piezoelectric actuators. By individually controlling the actuators 151a to 151ch, the shape of the reflective film 157 forming the surface (reflective surface) of the shape deformable mirror 151 can be deformed dynamically.

FIG. 3C is a view illustrating the sectional structure of the shape deformable mirror 151 illustrated in FIG. 3B. In the shape deformable mirror 151, magnets 154 are driven in a Pz direction by applying current to coils 153 arranged on a mirror substrate 152, and this can deform the shape of the reflective film 157. Accordingly, when the control unit 1100 controls the shape deformable mirror 151 to give a predetermined phase difference to light (detection light) MB entering the shape deformable mirror 151, a correction wavefront can be set. Note that as illustrated in FIG. 3C, a frame 155 and springs 156 are arranged between the magnets 154 and the reflective film 157. Thus, the drive of each magnet 154 is transmitted to the reflective film 157 at high speed with high accuracy. A high reflection ratio can be achieved by metal coating for the reflective film 157.

In this embodiment, the shape deformable mirror 151 has been described as an example of the configurations of the wavefront changing unit 175. However, the present invention is not limited to this, and any reflective spatial modulation element can be used. In addition, it need not be able to dynamically control the wavefront aberration. For example, an aspheric mirror having characteristics equivalent to those of the correction wavefront may be arranged.

In this embodiment, each of the detection unit 90 and a wavefront detection unit 86 detects the light from the target 72 via the reflective wavefront changing unit 175. In the wavefront changing unit 175, a first correction wavefront CW1 is set in the first region so as to correct a first wavefront aberration W1 and a second correction wavefront CW2 different from the first correction wavefront CW1 is set in the second region so as to correct a second wavefront aberration W2. With this, it is possible to decrease a measurement error caused by the wavefront aberrations in the detection system DS, and measure the position of the target 72, that is, the overlay error of the target 72 with high accuracy.

Third Embodiment

Figure 4A:
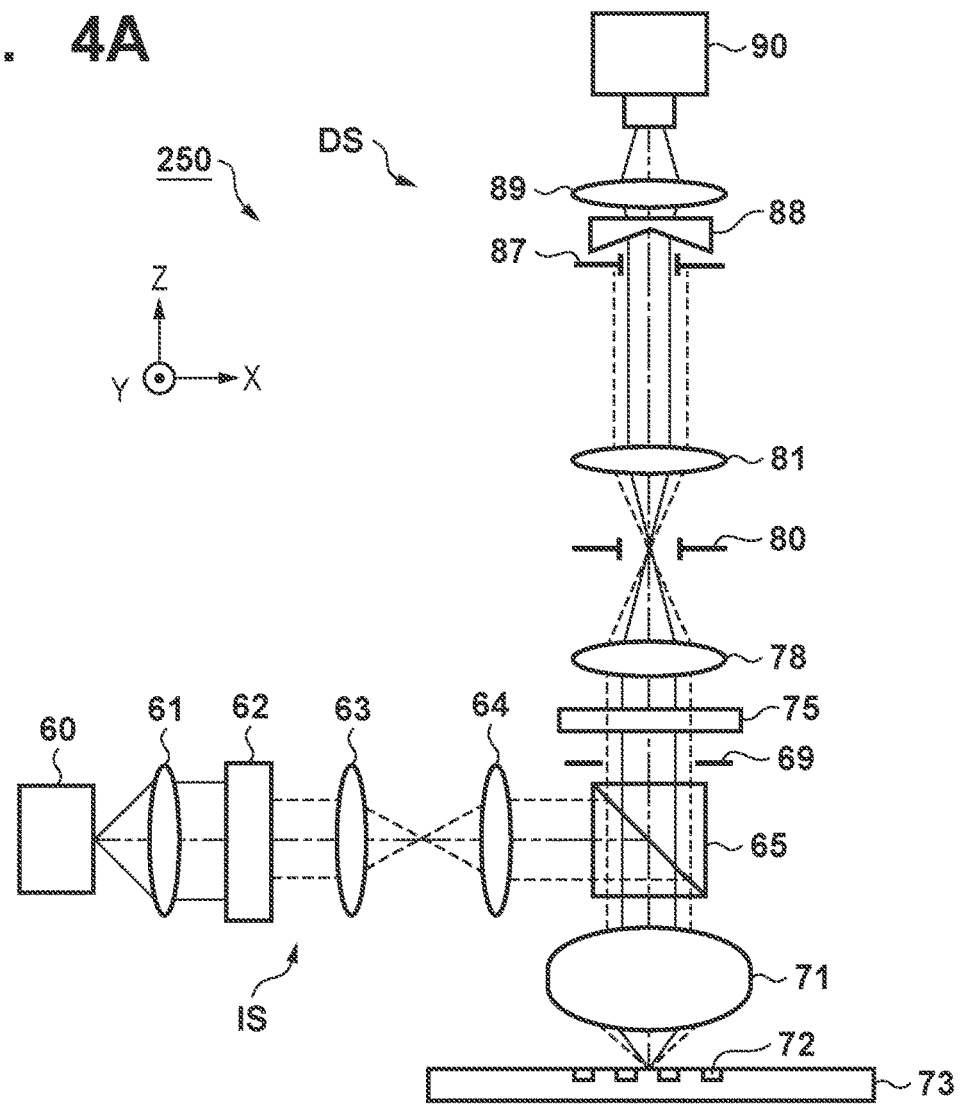
FIGS. 4A to 4C are views for explaining a measurement unit in the third embodiment.
Figure 4B:
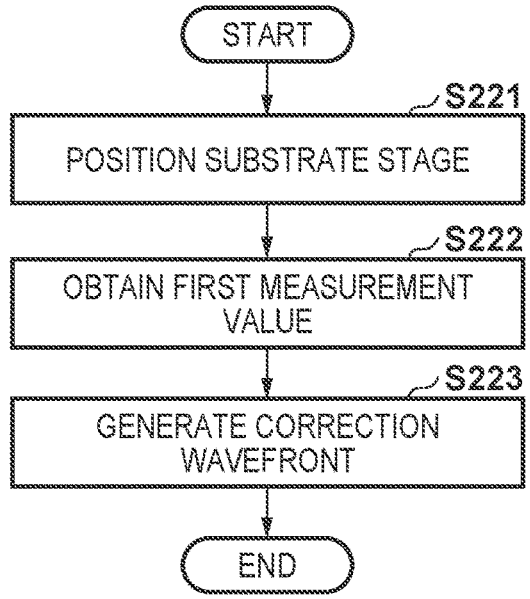
Figure 4C:
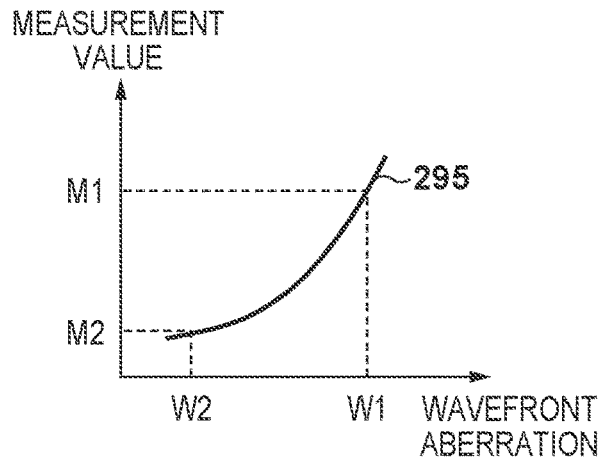

In this embodiment, a form in which a detection unit 90 detects the light from a target 72 via a wavefront changing unit 75 to measure the position of the target 72 will be described with reference to FIGS. 4A to 4C. FIGS. 4A to 4C are views for explaining a measurement unit 250 in this embodiment.

FIG. 4A is a view illustrating configurations of the measurement unit 250. The measurement unit 250 corresponds to the measurement unit 50 in the measurement apparatus 100 illustrated in FIG. 1B. The measurement unit 50 in the first embodiment includes both the wavefront changing unit 75 and the wavefront detection unit 86, but the measurement unit 250 in this embodiment includes the wavefront changing unit 75 alone, and no wavefront detection unit 86 is included. In the measurement unit 250, the light from the target 72 passes through imaging optical systems 78, 81, and 89 via the wavefront changing unit 75, and is detected by a detection unit 90.

In this embodiment, the measurement unit 250 acquires the first measurement value by measuring the position of the target 72 while setting the first wavefront aberration in the wavefront changing unit 75. Then, a control unit 1100 generates a correction wavefront by obtaining, based on information indicating the relationship between the wavefront aberration information and the measurement value of the position of the target 72, a wavefront aberration that makes the measurement value reach a target value.

With reference to FIG. 4B, the measurement process of the measurement unit 250 in this embodiment will be described. The measurement process is performed by the control unit 1100 comprehensively controlling respective units of a measurement apparatus 100.

In step S221, a substrate stage WS holding a substrate 73 is positioned such that the light from the target 72 is guided to the detection unit 90 (detection region thereof) in the measurement unit 250. The positioning of the substrate stage WS is similar to that in step S121 of FIG. 2A, so that a detailed description thereof will be omitted here.

In step S222, the first wavefront aberration is set in the wavefront changing unit 75, and the position of the target 72 is measured to acquire the first measurement value. An arbitrary wavefront aberration may be set as the first wavefront aberration. For example, a state with no wavefront aberration (a state in which the wavefront aberration is zero) may be set, or a wavefront aberration obtained based on data acquired in advance may be set.

In step S223, based on the first measurement value acquired ins step S222 and information indicating the relationship between the wavefront aberration information and the measurement value of the position of the target 72, a correction wavefront for correcting the wavefront aberration in a detection system DS is generated.

FIG. 4C is a view illustrating a curve 295 as an example of the information indicating the relationship between the wavefront aberration information and the measurement value of the position of the target 72. The curve 295 can be obtained in advance by, for example, setting a plurality of wavefront aberrations different from each other in the wavefront changing unit 75 and acquiring the measurement value of the position of the target 72 for each wavefront aberration. Note that wavefront aberrations (for example, coma aberrations) asymmetric with respect to the optical axis and having different sizes may be set in the wavefront changing unit 75.

In FIG. 4C, M1 indicates the first measurement value acquired in step S222, W1 indicates the wavefront aberration at the time when the first measurement value M1 is acquired, that is, the first wavefront aberration set in step S222, and M2 indicates the target value of the measurement value of the position of the target 72. W2 indicates the wavefront aberration at the time when the target value M2 is acquired as the measurement value of the position of the target 72. The wavefront aberration W2 is calculated based on the target value M2 and the curve 295. In step S223, a correction wavefront CW is generated from the difference between the wavefront aberration W2 and the first wavefront aberration W1, and the correction wavefront CW is set in the wavefront changing unit 75. Thus, the measurement value obtained when measuring the position of the target 72 can be made to reach the target value M2.

In this embodiment, the detection unit 90 detects the light from the target 72 via the wavefront changing unit 75 and, based on the measurement value and the first wavefront aberration, the correction wavefront that makes the measurement value of the position of the target 72 reach the target value is generated. Then, in the wavefront changing unit 75, the first correction wavefront is set in the first region so as to correct the first wavefront aberration and the second correction wavefront different from the first correction wavefront is set in the second region so as to correct the second wavefront aberration. With this, it is possible to decrease a measurement error caused by the wavefront aberration in the detection system DS, and measure the position of the target 72, that is, the overlay error of the target 72 with high accuracy.

Fourth Embodiment

In this embodiment, a form in which a pupil plane intensity detection unit 390 detects the light from a target 72 via a wavefront changing unit 75 will be described with reference to FIGS. 5A to 5D.

Figure 5A:
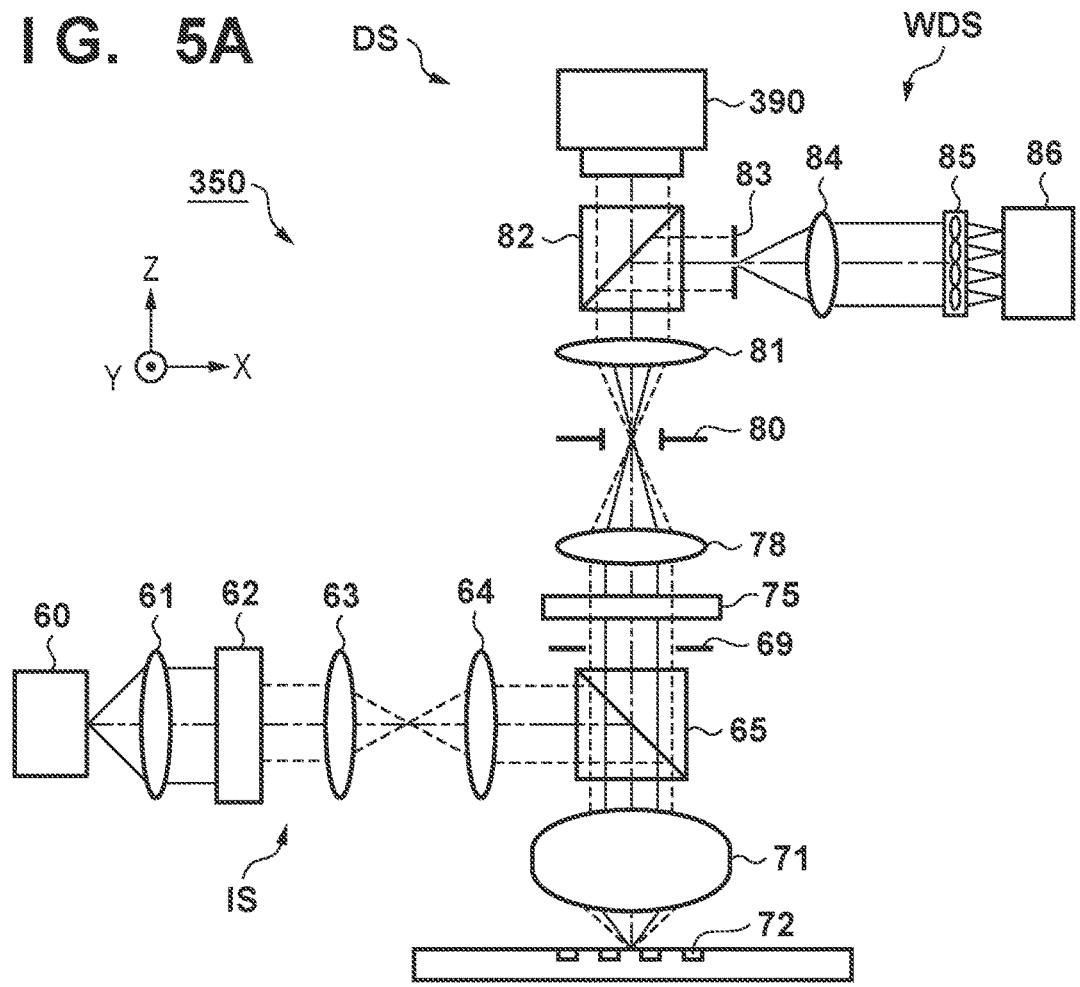
FIGS. 5A to 5D are views for explaining a measurement unit in the fourth embodiment.

FIG. 5A is a view illustrating configurations of a measurement unit 350. The measurement unit 350 corresponds to the measurement unit 50 in the measurement apparatus 100 illustrated in FIG. 1B. The measurement unit 350 is different from the measurement unit 50 in the first embodiment in that the light from the target 72 passes through imaging optical systems 78 and 81 via the wavefront changing unit 75, and is detected by the pupil plane intensity detection unit 390.

Figure 5B:
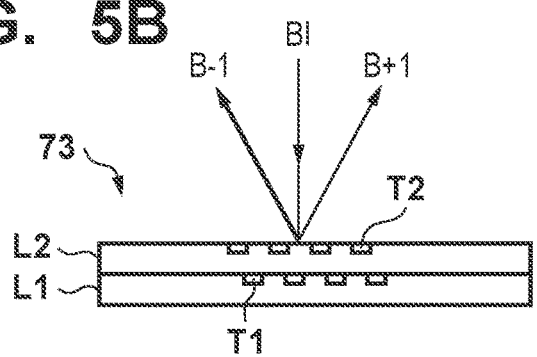
Figure 5C:
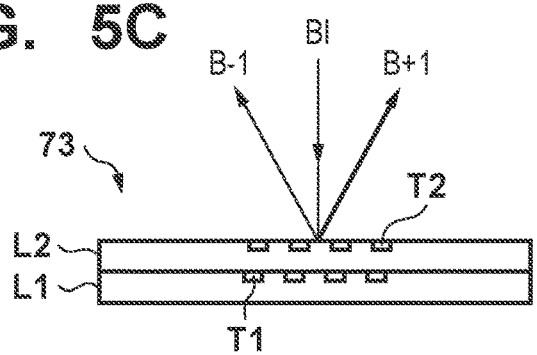

Here, with reference to FIGS. 5B and 5C, the principle of measuring the position of the target 72, that is, the overlay error by the measurement unit 350 will be described. In the measurement unit 350, the pupil plane intensity detection unit 390 detects the pupil plane intensity distribution of the light diffracted by the target 72. The target 72 is a pattern for overlay measurement, and includes a first pattern T1 formed in a first layer L1 on a substrate 73, and a second pattern T2 formed in a second layer L2 different from the first layer L1. As illustrated in FIGS. 5B and 5C, in accordance with the relative position between the first pattern T1 and the second pattern T2, an intensity difference occurs between +1st-order diffracted light B+1 and −1st-order diffracted light B−1 diffracted by the target 72. More specifically, in FIG. 5B, the intensity of the −1st-order diffracted light B−1 is higher than the intensity of the +1st-order diffracted light B+1, and in FIG. 5C, the intensity of the −1st-order diffracted light B−1 is lower than the intensity of the +1st-order diffracted light B+1. Accordingly, by obtaining the relationship between the pupil plane intensity distribution and the measurement value in advance, the overlay error of the target 72 can be obtained based on the pupil plane intensity distribution detected by the pupil plane intensity detection unit 390. Note that the relationship between the pupil plane intensity distribution and the measurement value (the overlay error of the target 72) is preferably obtained by, for example, referring to the measurement value of another optical overlay measurement apparatus or scanning electronic microscope.

Figure 5D:
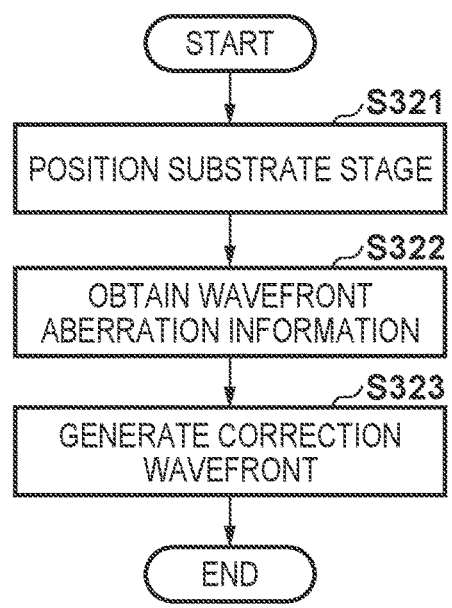

With reference to FIG. 5D, the measurement process of the measurement unit 350 in this embodiment will be described. The measurement process is performed by a control unit 1100 comprehensively controlling respective units of a measurement apparatus 100 as described above.

In step S321, a substrate stage WS holding a substrate 73 is positioned such that the light from the target 72 is guided to the pupil plane intensity detection unit 390 (detection region thereof) in the measurement unit 350. The positioning of the substrate stage WS is similar to that in step S121 of FIG. 2A, so that a detailed description thereof will be omitted here.

In step S322, a wavefront detection system WDS, that is, a wavefront detection unit 86 acquires wavefront aberration information concerning the wavefront aberrations in a detection system DS. More specifically, as in step S122, the wavefront aberration information is acquired by detecting, by the wavefront detection unit 86, the light having passed through a pinhole 83, a pupil imaging optical system 84, and a lens array 85.

In step S323, based on the wavefront aberration information acquired in step S322, a correction wavefront for correcting the wavefront aberrations in the detection system DS is generated. The generation of the correction wavefront is similar to that in step S123, so that a detailed description is omitted here.

In this embodiment, the overlay error of the target 72 is measured by detecting, by the pupil plane intensity detection unit 390, the light from the target 72 via the wavefront changing unit 75. Further, in the wavefront changing unit 75, the first correction wavefront is set in the first region so as to correct the first wavefront aberration and the second correction wavefront different from the first correction wavefront is set in the second region so as to correct the second wavefront aberration. With this, it is possible to decrease a measurement error caused by the wavefront aberrations in the detection system DS, and measure the position of the target 72, that is, the overlay error of the target 72 with high accuracy.

Fifth Embodiment

In this embodiment, a form in which the position of a target 72 is measured by detecting, by a detection unit 90, the light from the target 72 via a wavefront changing unit 75 will be described with reference to FIGS. 6A to 6D. FIGS. 6A to 6D are views for explaining a measurement unit 450 in this embodiment.

Figure 6A:
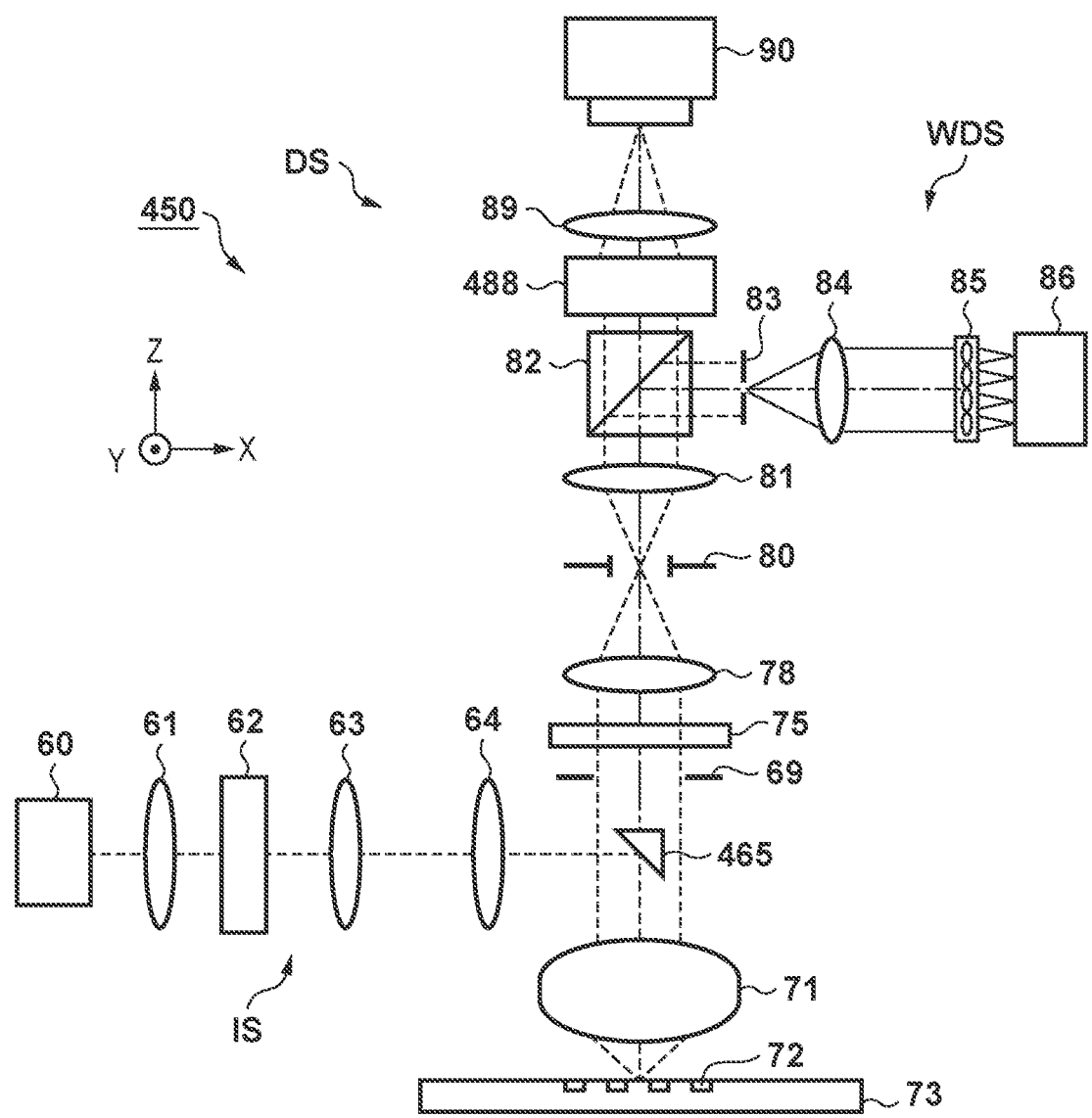
FIGS. 6A to 6D are views for explaining a measurement unit in the fifth embodiment.

FIG. 6A is a view illustrating configurations of the measurement unit 450. The measurement unit 450 corresponds to the measurement unit 50 in the measurement apparatus 100 illustrated in FIG. 1B. The measurement unit 50 in the first embodiment measures the relative position (overlay error) between patterns formed in different layers on a substrate. On the other hand, the measurement unit 450 in this embodiment measures the position of the target 72 by detecting the light diffracted by the target 72 while changing (moving) the position of the target 72 with respect to the measurement unit 450 (the detection region of the detection unit 90).

The measurement unit 450 obtains the position of the target 72 based on the change in intensity of the light from the target 72 detected by the detection unit 90 while changing the position of the target 72 in the optical axis cross section of the detection unit 90 (in the detection region thereof) under the control of the control unit 1100. An example of the method of changing the position of the target 72 is a method of driving a substrate stage WS holding a substrate 73 in the X-Y cross section at a constant speed by the control unit 1100.

The light emitted from a light source 60 is guided to a mirror 465 via an illumination optical system 61, an illumination aperture stop mechanism 62, and illumination optical systems 63 and 64. The light reflected by the mirror 465 illuminates, via an objective optical system 71, the target 72 provided on the substrate 73.

The light reflected, diffracted, and scattered by the target 72 provided on the substrate 73 passes through an aperture stop 69, the wavefront changing unit 75, and an imaging optical system 78 via the objective optical system 71, and is guided to a detection field stop 80. The light from the detection field stop 80 is guided to the detection unit 90 via an imaging optical system 81, a prism 488, and an imaging optical system 89. The detection unit 90 may be configured such that an image sensor detects the light via a spectral member, thereby detecting the light components of multiple different wavelengths by different pixels in the image sensor. Alternatively, the detection unit 90 may be configured such that a dichroic prism separates the multiple different wavelengths for each wavelength and a photodetector is used to detect the light intensity of each wavelength. The configurations of a wavefront detection system WDS from a beam splitter 82 to a wavefront detection unit 86 are similar to those in the first embodiment, so that a detailed description thereof will be omitted here.

Figure 6B:
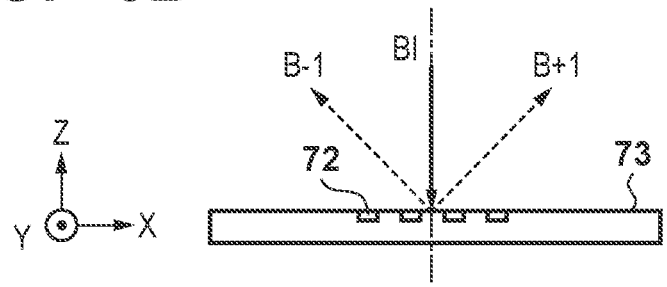

Here, with reference to FIGS. 6B and 6C, the principle of measuring the position of the target 72 by the measurement unit 450 will be described. In the measurement unit 450, the substrate 73 is illuminated via an illumination system IS, and the light diffracted by the target 72 is detected via a detection system DS. FIG. 6B illustrates light (illumination light) BI entering perpendicular to the substrate 73, and +1st-order diffracted light B+1 and −1st-order diffracted light B−1 from the target 72. Note that the shapes of the mirror 465 and the aperture stop 69 may be decided such that the light (light including 0th-order diffracted light) which is unnecessary for measuring the position of the target 72 is blocked in the detection system DS.

Figure 6C:
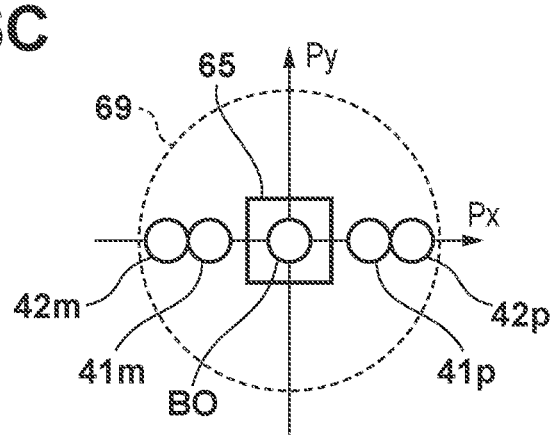

FIG. 6C is a view illustrating the relative position between the inner diameter of the aperture portion of the aperture stop 69 and the light diffracted by the target 72. In FIG. 6C, BO indicates the 0th-order diffracted light diffracted by the target 72. Since the 0th-order diffracted light BO is blocked by, for example, the mirror 465 as has been described above, it is not guided to the detection unit 90. 41m indicates the −1st-order diffracted light in the light of the first wavelength, and 41p indicates the +1st-order diffracted light in the light of the first wavelength. 42m indicates the −1st-order diffracted light in the light of the second wavelength, and 42p indicates the +1st-order diffracted light in the light of the second wavelength. The −1st-order diffracted light 41m, the −1st-order diffracted light 42m, the +1st-order diffracted light 41p, and the +1st-order diffracted light 42p diffracted by the target 72 pass inside the aperture stop 69 (aperture thereof), and are detected by each of the wavefront detection unit 86 and the detection unit 90 via the wavefront changing unit 75. Note that acquisition of wavefront aberration information and generation of a correction wavefront are similar to those in steps S122 and S123, so that a detailed description thereof will be omitted here.

Figure 6D:
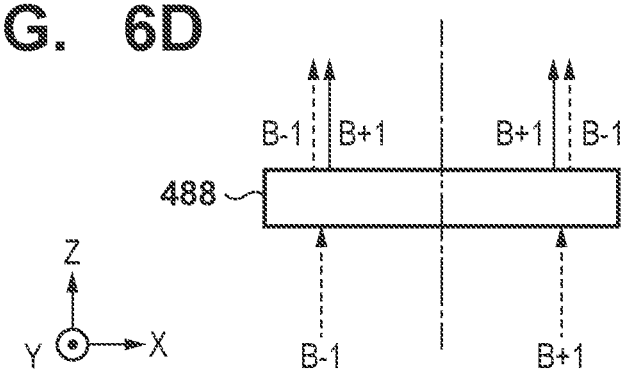

FIG. 6D is a view for explaining the function of the prism 488 in the measurement unit 450. The prism 488 is arranged on the pupil plane of the detection system DS. The prism 488 is an optical member that separates and inverts the light components diffracted by the target 72, and then overlaps them. As illustrated in FIG. 6D, the +1st-order diffracted light B+1 and the −1st-order diffracted light B−1 are separated, inverted, and overlapped by the prism 488, and are guided to the detection unit 90. The detection unit 90 detects the intensity of the interference light of the +1st-order diffracted light B+1 and the −1st-order diffracted light B−1. Since the intensities of the +1st-order diffracted light B+1 and the −1st-order diffracted light B−1 change in accordance with the position of the target 72 in the detection unit 90 (in the detection region thereof), the intensity of the light detected by the detection unit 90 also changes. Accordingly, the position of the target 72 can be obtained based on the position information of the target 72 and the intensity information of the light detected by the detection unit 90.

Further, in the measurement unit 450, the light from the target 72 is detected by the detection unit 90 via the wavefront changing unit 75. Generation of a correction wavefront to be set in the wavefront changing unit 75 under the control of the control unit 1100 is similar to that in step S123, so that a detailed description thereof will be omitted here.

In this embodiment, the position of the target 72 is measured by detecting, by the detection unit 90, the light from the target 72 via the wavefront changing unit 75. Further, in the wavefront changing unit 75, the first correction wavefront is set in the first region so as to correct the first wavefront aberration and the second correction wavefront different from the first correction wavefront is set in the second region so as to correct the second wavefront aberration. With this, it is possible to decrease a measurement error caused by the wavefront aberrations in the detection system DS, and measure the position of the target 72 with high accuracy.

Sixth Embodiment

Figure 7:
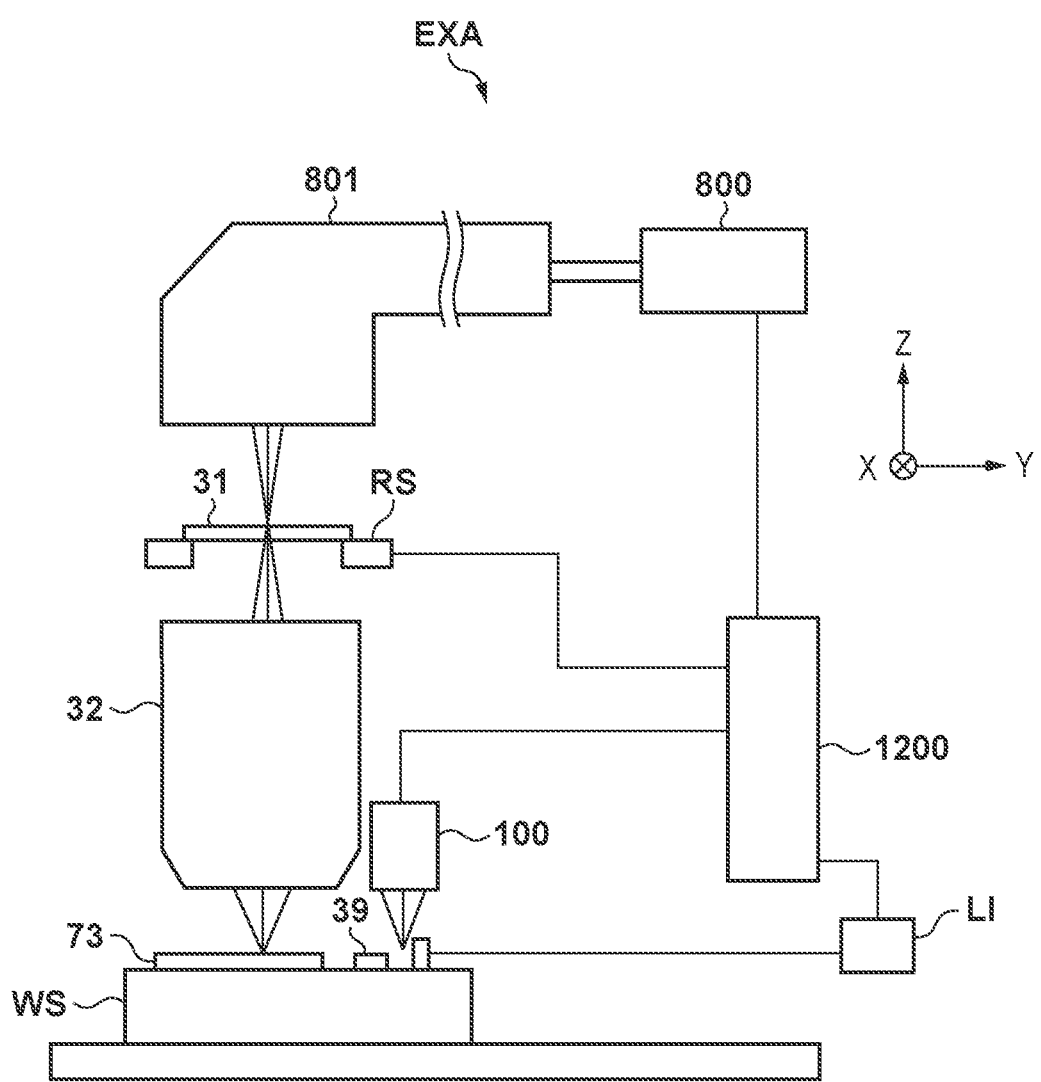
FIG. 7 is a schematic view illustrating configurations of an exposure apparatus according to an aspect of the present invention.

FIG. 7 is a schematic view illustrating configurations of an exposure apparatus EXA. The exposure apparatus EXA is a lithography apparatus which is used in a lithography process as a manufacturing process of a device such as a semiconductor device or a liquid crystal display device and forms a pattern on a substrate 73. The exposure apparatus EXA exposes the substrate 73 via a reticle 31 serving as an original, thereby transferring the pattern of the reticle 31 onto the substrate 73. In this embodiment, the exposure apparatus EXA employs a step-and-scan method, but it can also employ a step-and-repeat method or other exposure methods.

As illustrated in FIG. 7, the exposure apparatus EXA includes an illumination optical system 801, a reticle stage RS which holds the reticle 31, a projection optical system 32, a substrate stage WS which holds the substrate 73, a measurement apparatus 100, and a control unit 1200.

The illumination optical system 801 is an optical system that illuminates an illuminated surface using light from a light source unit 800. The light source unit 800 includes, for example, a laser. The laser includes an ArF excimer laser having a wavelength of about 193 nm, a KrF excimer laser having a wavelength of about 248 nm, or the like, but the type of light source is not limited to the excimer laser. For example, the light source unit 800 may use, as the light source, an $F_2$ laser having a wavelength of about 157 nm or Extreme Ultraviolet (EUV) having a wavelength of 20 nm or less.

In this embodiment, the illumination optical system 801 shapes the light from the light source unit 800 into slit light having a predetermined shape suitable for exposure, and illuminates the reticle 31. The illumination optical system 801 has a function of uniformly illuminating the reticle 31 and a polarizing illumination function. The illumination optical system 801 includes, for example, a lens, a mirror, an optical integrator, a stop, and the like, and is formed by arranging a condenser lens, a fly-eye lens, an aperture stop, a condenser lens, a slit, and an imaging optical system in this order.

The reticle 31 is formed of, for example, quartz. The reticle 31 is formed with a pattern (circuit pattern) to be transferred onto the substrate 73.

The reticle stage RS holds the reticle 31 via a reticle chuck (not illustrated), and is connected to a reticle driving mechanism (not illustrated). The reticle driving mechanism includes a linear motor or the like, and can move the reticle 31 held by the reticle stage RS by driving the reticle stage RS in the X-axis direction, the Y-axis direction, the Z-axis direction, and the rotation directions around the respective axes. Note that the position of the reticle 31 is measured by a reticle position measurement unit of oblique light-incidence type (not illustrated), and the reticle 31 is arranged at a predetermined position via the reticle stage RS.

The projection optical system 32 has a function of imaging the light from an object plane in an image plane. In this embodiment, the projection optical system 32 projects the light (diffracted light) having passed through the pattern of the reticle 31 onto the substrate 73, thereby forming the image of the pattern of the reticle 31 on the substrate. As the projection optical system 32, an optical system formed from a plurality of lens elements, an optical system (catadioptric optical system) including a plurality of lens elements and at least one concave mirror, an optical system including a plurality of lens elements and at least one diffractive optical element such as kinoform, or the like is used.

A photoresist is applied onto the substrate 73. The substrate 73 is a processing target object to which the pattern of the reticle 31 is transferred, and includes a wafer, a liquid crystal substrate, another processing target substrate, or the like.

The substrate stage WS holds the substrate 73 via a substrate chuck (not illustrated), and is connected to a substrate driving mechanism (not illustrated). The substrate driving mechanism includes a linear motor or the like, and can move the substrate 73 held by the substrate stage WS by driving the substrate stage WS in the X-axis direction, the Y-axis direction, the Z-axis direction, and the rotation directions around the respective axes. Further, a reference plate 39 is provided on the substrate stage WS. The height of the surface of the reference plate 39 is decided so as to be flush with the surface of the substrate 73 held by the substrate stage WS. The measurement apparatus 100 also measures the position of the reference mark provided on the reference plate 39.

The position of the reticle stage RS and the position of the wafer stage WS are monitored by, for example, a 6-axis laser interferometer LI or the like, and the reticle stage RS and the substrate stage WS are driven at a constant speed ratio under the control of the control unit 1200.

The measurement apparatus 100 measures, as the target, the position of the mark provided on the substrate 73. The form of the measurement apparatus 100 is similar to that described in each of the first to fifth embodiments, so that a detailed description thereof will be omitted here.

The control unit 1200 is formed by a computer (information processing apparatus) including a CPU, a memory, and the like and, for example, operates the exposure apparatus EXA by comprehensively controlling respective units of the exposure apparatus EXA in accordance with a program stored in a storage unit. The control unit 1200 controls the exposure process of transferring the pattern of the reticle 31 onto the substrate 73 by exposing the substrate 73 via the reticle 31. Further, in this embodiment, the control unit 1200 also controls the measurement process in the measurement apparatus 100 and the correction process (calculation process) of a measurement value obtained by the measurement apparatus 100. In this manner, the control unit 1200 also functions as a part of the measurement apparatus 100.

In the exposure apparatus EXA, the light (diffracted light) having passed through the reticle 31 is projected onto the substrate 73 via the projection optical system 32. The reticle 31 and the substrate 73 are arranged in an optically conjugate relationship. The pattern of the reticle 31 is transferred onto the substrate 73 by scanning the reticle 31 and the substrate 73 at a speed ratio corresponding to the reduction magnification ratio of the projection optical system 32.

Figure 8:
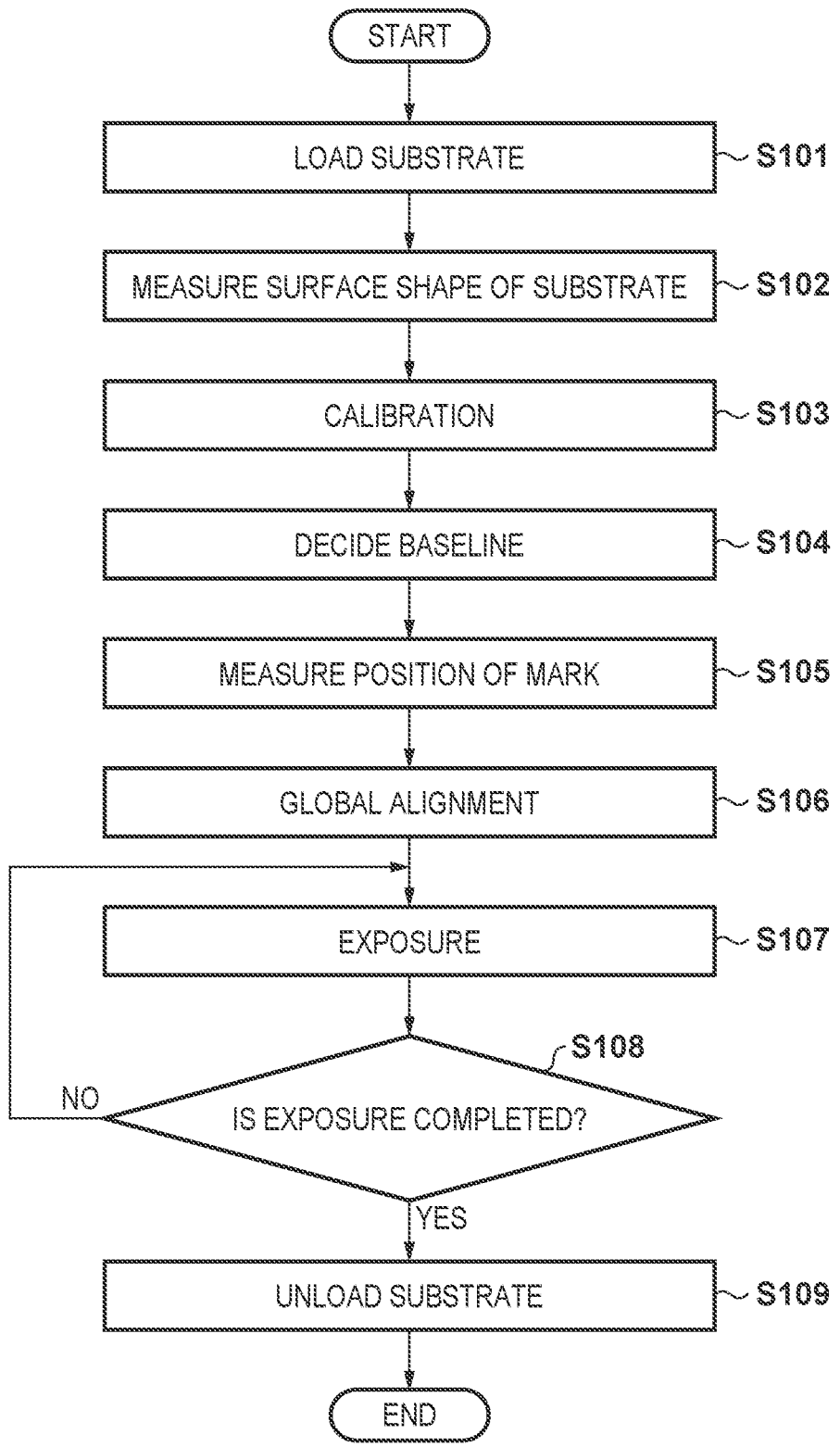
FIG. 8 is a flowchart for explaining the sequence of an exposure process of exposing a substrate.

Next, with reference to FIG. 8, the sequence of the exposure process of transferring the pattern of the reticle 31 onto the substrate 73 by exposing the substrate 73 via the reticle 31 will be described. As has been described above, the exposure process is performed by the control unit 1200 comprehensively controlling the respective units of the exposure apparatus EXA.

In step S101, the substrate 73 is loaded in the exposure apparatus EXA. In step S102, the surface (height) of the substrate 73 is detected by a shape measurement apparatus (not illustrated) to measure the surface shape of the entire substrate 73.

In step S103, calibration is performed. More specifically, based on the designed coordinate position of the reference mark provided on the reference plate 39 in the stage coordinate system, the wafer stage WS is driven so as to position the reference mark on the optical axis of the measurement apparatus 100. Then, the positional shift of the reference mark with respect to the optical axis of the measurement apparatus 100 is measured, and the stage coordinate system is reset based on the positional shift such that the origin of the stage coordinate system coincides with the optical axis of the measurement apparatus 100. Here, in order to measure the positional shift of the reference mark, a measurement process using the reference mark as the target is performed as has been described with reference to FIG. 2A. Note that when measuring a plurality of reference marks, steps S121 to S123 illustrated in FIG. 2A need not be performed for each reference mark. Steps S121 to S123 illustrated in FIG. 2A may be performed every predetermined number of measurement processes, or every predetermined number of the substrates 73 on each of which the exposure process is performed. Next, based on the designed positional relationship between the optical axis of the measurement apparatus 100 and the optical axis of the projection optical system 32, the substrate stage WS is driven so as to position the reference mark on the optical axis of the exposure light. Then, the positional shift of the reference mark with respect to the optical axis of the exposure light is measured via the projection optical system 32 by a TTL (Through The Lens) measurement system.

In step S104, based on the result of calibration obtained in step S103, the baseline between the optical axis of the measurement apparatus 100 and the optical axis of the projection optical system 32 is determined.

In step S105, the measurement apparatus 100 measures the position of the mark while using the mark provided on the substrate 73 as the target. Here, in order to measure the positional shift of the mark on the substrate 73, a measurement process using the mark on the substrate 73 as the target is performed as has been described with reference to FIG. 2A. Note that when measuring a plurality of marks on the substrate 73, steps S121 to S123 illustrated in FIG. 2A need not be performed for each mark. Steps S121 to S123 illustrated in FIG. 2A may be performed every predetermined number of measurement processes, or every predetermined number of the substrates 73 on each of which the exposure process is performed.

In step S106, global alignment is performed. More specifically, based on the measurement result obtained in step S105, the shift, the magnification, and the rotation with respect to the array of shot regions on the substrate 73 are calculated, and the regularity of the array of the shot regions is obtained. Then, a correction coefficient is obtained from the regularity of the array of the shot regions and the baseline, and the substrate 73 is aligned with the reticle 31 (exposure light) based on the correction coefficient.

In step S107, the substrate 73 is exposed while scanning the reticle 31 and the substrate 73 in a scanning direction (Y direction). At this time, based on the surface shape of the substrate 73 measured by the shape measurement apparatus, an operation of sequentially adjusting the surface of the substrate 73 to the imaging plane of the projection optical system 32 is also performed by driving the substrate stage WS in the Z direction and the tilt direction.

In step S108, it is determined whether exposure for all the shot regions of the substrate 73 has been completed (that is, whether there is no unexposed shot region). If exposure for all the shot regions of the substrate 73 has not been completed, the process returns to step S107, and steps S107 and S108 are repeated until exposure for all the shot regions is completed. On the other hand, if exposure for all the shot regions of the substrate 73 has been completed, the process advances to step S109, and the substrate 73 is unloaded from the exposure apparatus EXA.

In this embodiment, the exposure apparatus has been described as an example of the lithography apparatus, but the present invention is not limited to this. For example, the lithography apparatus may be an imprint apparatus that forms a pattern of an imprint material on a substrate using a mold (template) including a pattern (concave and convex portions). Further, the lithography apparatus may be a planarization apparatus that planarizes (molds) a composition on a substrate using a mold (flat template) including a flat portion. Further, the lithography apparatus may be a drawing apparatus that performs drawing on a substrate using a charged particle beam (an electron beam or an ion beam) via a charged particle optical system, thereby forming a pattern on the substrate.

Seventh Embodiment

A method of manufacturing an article according to the embodiment of the present invention is suitable for manufacturing an article, for example, a liquid crystal display element, a semiconductor element, a flat panel display, or a MEMS. The manufacturing method includes a process of exposing, using the above-described exposure apparatus EXA or exposure method, a substrate to which a photoresist is applied, and a process of developing the exposed photoresist. In addition, an etching process, an ion implantation process, and the like are performed for the substrate using the pattern of the developed photoresist as a mask, thereby forming a circuit pattern on the substrate. By repeating the processes of exposure, development, etching, and the like, a circuit pattern formed by a plurality of layers is formed on the substrate. In the post-process, dicing (processing) is performed for the substrate on which the circuit pattern is formed, and chip mounting, bonding, and inspection processes are performed. The manufacturing method can also include other known processes (for example, oxidation, deposition, vapor deposition, doping, planarization, and resist removal). The method of manufacturing an article according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2022-030176 filed on Feb. 28, 2022, which is hereby incorporated by reference herein in its entirety.

What is claimed is:

1. A measurement apparatus for measuring a position of a target, comprising:
   an illumination system configured to illuminate the target with light including light of a first wavelength and light of a second wavelength different from the first wavelength;
   a wavefront changing unit configured to change a wavefront aberration in light from the target; and
   a control unit configured to control the wavefront changing unit,
   wherein the wavefront changing unit includes a first region where the light of the first wavelength enters, and a second region where the light of the second wavelength enters, and
   the control unit obtains a correction wavefront for correcting a wavefront aberration asymmetric with respect to an optical axis based on a first wavefront aberration in the light of the first wavelength and a second wavefront aberration in the light of the second wavelength and controls the wavefront changing unit such that a first correction wavefront for correcting the first wavefront aberration is generated in the first region, and a second correction wavefront for correcting the second wavefront aberration is generated in the second region based on the correction wavefront.

2. The apparatus according to claim 1, further comprising a wavefront detection unit configured to detect the first wavefront aberration in the light of the first wavelength and the second wavefront aberration in the light of the second wavelength,
   wherein the control unit controls the wavefront changing unit such that the first correction wavefront is generated in the first region based on the first wavefront aberration detected by the wavefront detection unit, and the second correction wavefront is generated in the second region based on the second wavefront aberration detected by the wavefront detection unit.

3. The apparatus according to claim 2, wherein the wavefront detection unit detects the first wavefront aberration and the second wavefront aberration based on the light including the light of the first wavelength and the light of the second wavelength entering via the wavefront changing unit.

4. The apparatus according to claim 1, wherein the control unit obtains a correction wavefront for correcting the first wavefront aberration and the second wavefront aberration from a third wavefront aberration obtained by connecting the first wavefront aberration and the second wavefront aberration so as to correspond to the first region and the second region, and controls the wavefront changing unit based on the correction wavefront such that the first correction wavefront is generated in the first region and the second correction wavefront is generated in the second region.

5. The apparatus according to claim 4, wherein the control unit obtains the third wavefront aberration by connecting the first wavefront aberration and the second wavefront aberration in a radial direction on a pupil plane.

6. The apparatus according to claim 1, wherein the control unit
obtains a correction wavefront for correcting the first wavefront aberration and the second wavefront aberration by connecting the first correction wavefront and the second correction wavefront so as to correspond to the first region and the second region, and
controls the wavefront changing unit based on the correction wavefront such that the first correction wavefront is generated in the first region and the second correction wavefront is generated in the second region.

7. The apparatus according to claim 6, wherein the control unit obtains the correction wavefront by connecting the first correction wavefront and the second correction wavefront in a radial direction on a pupil plane.

8. The apparatus according to claim 1, wherein the wavefront changing unit includes a shape deformable mirror including a reflective film forming a reflective surface which reflects the light from the target, and an actuator configured to deform a shape of the reflective film.

9. The apparatus according to claim 1, wherein the control unit
obtains, based the first wavefront aberration, the second wavefront aberration, and information indicating a relationship between a wavefront aberration in the light from the target and a measurement error of a position of the target, a correction wavefront for correcting the first wavefront aberration and the second wavefront aberration, and
controls the wavefront changing unit based on the correction wavefront.

10. The apparatus according to claim 1, wherein the control unit
obtains, based on the first wavefront aberration and information indicating a relationship between a wavefront aberration in the light from the target and a measurement value of a position of the target, a correction wavefront that makes the measurement value of the position of the target reach a target value, and
controls, based on the correction wavefront, the wavefront changing unit such that the first correction wavefront is generated in the first region and the second correction wavefront is generated in the second region.

11. The apparatus according to claim 1, further comprising
a detection unit configured to detect the light from the target via the wavefront changing unit,
wherein the control unit obtains the position of the target based on the light from the target detected by the detection unit.

12. The apparatus according to claim 11, further comprising
an objective optical system arranged between the detection unit and the target,
wherein the wavefront changing unit is arranged on a pupil plane of the objective optical system.

13. The apparatus according to claim 11, wherein each of the first wavefront aberration and the second wavefront aberration includes a wavefront aberration in the detection unit.

14. The apparatus according to claim 11, wherein the target includes a first pattern and a second pattern, and the control unit obtains a relative position between the first pattern and the second pattern.

15. A lithography apparatus for forming a pattern on a substrate, the apparatus comprising:
a measurement apparatus according to claim 1, configured to measure a position of a target while using, as the target, a mark provided on the substrate; and
a stage configured to position the substrate based on the position of the target measured by the measurement apparatus.

16. An apparatus according to claim 15, further comprising
a projection optical system configured to project a pattern of a reticle onto the substrate.

17. A measurement method of measuring a position of a target using a measurement apparatus that comprises an illumination system configured to illuminate the target with light including light of a first wavelength and light of a second wavelength different from the first wavelength, and a wavefront changing unit configured to change a wavefront aberration in light from the target, wherein
the wavefront changing unit includes a first region where the light of the first wavelength enters, and a second region where the light of the second wavelength enters, and
the method comprises:
obtaining a correction wavefront for correcting a wavefront aberration asymmetric with respect to an optical axis based on a first wavefront aberration in the light of the first wavelength and a second wavefront aberration in the light of the second wavelength, and
controlling the wavefront changing unit such that a first correction wavefront for correcting the first wavefront aberration is generated in the first region, and a second correction wavefront for correcting the second wavefront aberration is generated in the second region based on the correction wavefront.

18. An article manufacturing method comprising:
measuring, using a measurement method according to claim 17, a position of a target while using, as the target, a mark provided on a substrate;
positioning the substrate based on the position of the target measured in the measuring;
forming a pattern on the substrate positioned in the positioning; and
manufacturing an article from the substrate with the pattern formed thereon in the forming.

19. A measurement apparatus for measuring a position of a target, comprising:
an illumination system configured to illuminate the target with light including light of a first wavelength and light of a second wavelength different from the first wavelength;
a wavefront changing unit configured to change a wavefront aberration in light from the target; and
a control unit configured to control the wavefront changing unit,
wherein the wavefront changing unit includes a first region where the light of the first wavelength enters, and a second region where the light of the second wavelength enters, and the control unit obtains a correction wavefront that sets a first correction wavefront for correcting a first wavefront aberration in the light of the first wavelength and a second correction wavefront for correcting a second wavefront aberration in the light of the second wavelength at predetermined focal positions respectively based on the first wavefront aberration and the second wavefront aberration and controls the wavefront changing unit such that the first correction wavefront is generated in the first region, and the second correction wavefront is generated in the second region based on the correction wavefront.

20. A lithography apparatus for forming a pattern on a substrate, the apparatus comprising:
    a measurement apparatus according to claim 19, configured to measure a position of a target while using, as the target, a mark provided on the substrate; and
    a stage configured to position the substrate based on the position of the target measured by the measurement apparatus.

21. A measurement method of measuring a position of a target using a measurement apparatus that comprises an illumination system configured to illuminate the target with light including light of a first wavelength and light of a second wavelength different from the first wavelength, and a wavefront changing unit configured to change a wavefront aberration in light from the target, wherein
    the wavefront changing unit includes a first region where the light of the first wavelength enters, and a second region where the light of the second wavelength enters, and
    the method comprises:
    obtaining a correction wavefront that sets a first correction wavefront for correcting a first wavefront aberration in the light of the first wavelength and a second correction wavefront for correcting a second wavefront aberration in the light of the second wavelength at predetermined focal positions respectively based on the first wavefront aberration and the second wavefront aberration, and
    controlling the wavefront changing unit such that the first correction wavefront is generated in the first region, and the second correction wavefront is generated in the second region based on the correction wavefront.

22. An article manufacturing method comprising:
    measuring, using a measurement method according to claim 21, a position of a target while using, as the target, a mark provided on a substrate;
    positioning the substrate based on the position of the target measured in the measuring;
    forming a pattern on the substrate positioned in the positioning; and
    manufacturing an article from the substrate with the pattern formed thereon in the forming.

23. A measurement apparatus for measuring a position of a target, comprising:
    an illumination system configured to illuminate the target with light including light of a first wavelength and light of a second wavelength different from the first wavelength;
    a wavefront changing unit configured to change a wavefront aberration in light from the target;
    a detection unit configured to detect the light from the target via the wavefront changing unit; and
    a control unit configured to control the wavefront changing unit,
    wherein the wavefront changing unit includes a first region where the light of the first wavelength enters, and a second region where the light of the second wavelength enters,
    wherein the control unit controls the wavefront changing unit such that a first correction wavefront for correcting a first wavefront aberration in the light of the first wavelength is generated in the first region, and a second correction wavefront for correcting a second wavefront aberration in the light of the second wavelength is generated in the second region and obtains the position of the target based on the light from the target detected by the detection unit, and
    wherein each of the first wavefront aberration and the second wavefront aberration includes a wavefront aberration in the detection unit.

24. A lithography apparatus for forming a pattern on a substrate, the apparatus comprising:
    a measurement apparatus according to claim 23, configured to measure a position of a target while using, as the target, a mark provided on the substrate; and
    a stage configured to position the substrate based on the position of the target measured by the measurement apparatus.

25. A measurement method of measuring a position of a target using a measurement apparatus that comprises an illumination system configured to illuminate the target with light including light of a first wavelength and light of a second wavelength different from the first wavelength, a wavefront changing unit configured to change a wavefront aberration in light from the target, and a detection unit configured to detect the light from the target via the wavefront changing unit, wherein
    the wavefront changing unit includes a first region where the light of the first wavelength enters, and a second region where the light of the second wavelength enters, and
    the method comprises:
    acquiring a first wavefront aberration in the light of the first wavelength and a second wavefront aberration in the light of the second wavelength,
    controlling the wavefront changing unit such that a first correction wavefront for correcting the first wavefront aberration is generated in the first region, and a second correction wavefront for correcting the second wavefront aberration is generated in the second region, and
    obtaining the position of the target based on the light from the target detected by the detection unit,
    wherein each of the first wavefront aberration and the second wavefront aberration includes a wavefront aberration in the detection unit.

26. An article manufacturing method comprising:
    measuring, using a measurement method according to claim 25, a position of a target while using, as the target, a mark provided on a substrate;
    positioning the substrate based on the position of the target measured in the measuring;
    forming a pattern on the substrate positioned in the positioning; and
    manufacturing an article from the substrate with the pattern formed thereon in the forming.

* * * * *